(12) United States Patent
Yap et al.

(10) Patent No.: US 9,490,292 B1
(45) Date of Patent: Nov. 8, 2016

(54) DUAL-BAND DETECTOR ARRAY

(71) Applicant: HRL LABORATORIES LLC, Malibu, CA (US)

(72) Inventors: Daniel Yap, Newbury Park, CA (US); Rajesh D. Rajavel, Oak Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/214,004

(22) Filed: Mar. 14, 2014

Related U.S. Application Data

(60) Provisional application No. 61/792,328, filed on Mar. 15, 2013.

(51) Int. Cl.
  *H01L 27/146* (2006.01)

(52) U.S. Cl.
  CPC ... *H01L 27/14652* (2013.01); *H01L 27/14629* (2013.01); *H01L 27/14636* (2013.01)

(58) Field of Classification Search
  CPC .............. H01L 27/15; H01L 27/146; H01L 27/14621; H01L 27/14625; H01L 27/14629; H01L 27/14647; H01L 27/14669; H01L 27/1446; H01L 31/18; H01L 31/02016; H01L 31/109; H01L 31/11; H01L 31/065
  See application file for complete search history.

(56) References Cited

U.S. PATENT DOCUMENTS

| | | | |
|---|---|---|---|
| 4,183,035 A | 1/1980 | Wang et al. | |
| 4,496,788 A | 1/1985 | Hamakawa et al. | |
| 4,675,525 A | 6/1987 | Amingual et al. | |
| 5,080,725 A | 1/1992 | Green et al. | |
| 5,239,179 A | 8/1993 | Baker | |
| 5,581,084 A | 12/1996 | Chapman et al. | |
| 5,721,429 A | 2/1998 | Radford et al. | |
| 5,963,790 A | 10/1999 | Matsuno et al. | |
| 5,977,557 A * | 11/1999 | Kim ........................ | H01L 31/11 257/21 |
| 6,294,723 B2 | 9/2001 | Uematsu et al. | |
| 6,545,289 B1 | 4/2003 | Gunapala et al. | |
| 6,852,920 B2 | 2/2005 | Sager et al. | |
| 6,858,462 B2 | 2/2005 | Zaidi et al. | |
| 7,545,051 B2 | 6/2009 | Yang et al. | |

(Continued)

FOREIGN PATENT DOCUMENTS

JP        05259427 A      10/1993

OTHER PUBLICATIONS

Tokranova, N., et al.,"Hybrid Solar Cells Based on Organic Materials Embedded Into Porous Silicon," Proc. SPIE, 5724, 183-190 (2005).

(Continued)

*Primary Examiner* — Kyoung Lee
(74) *Attorney, Agent, or Firm* — Janus Law Group

(57) ABSTRACT

An infrared photo-detector array and a method for manufacturing it are disclosed. The infrared photo-detector array contains a collector layer, a first absorber layer that absorbs incident light of a first wavelength band and generates first electrons and first holes, a second absorber layer that absorbs incident light of a second wavelength band and generates second electrons and second holes, and wherein the wavelengths of the incident light in the first wavelength band are shorter than the wavelengths of the incident light in the second wavelength band, and wherein the second absorber layer is laterally contiguous across at least two photo-detectors. The method disclosed teaches how to manufacture the infrared photo-detector array.

29 Claims, 15 Drawing Sheets

(56) References Cited

U.S. PATENT DOCUMENTS

| | | |
|---|---|---|
| 2002/0135869 A1 | 9/2002 | Banish et al. |
| 2004/0045932 A1 | 3/2004 | Kochergin et al. |
| 2005/0109388 A1 | 5/2005 | Murakami et al. |
| 2006/0251995 A1 | 11/2006 | Wille et al. |
| 2008/0072958 A1 | 3/2008 | Dutta |

OTHER PUBLICATIONS

Technical Information document (SD-12), Characteristics and use of infrared detectors, by Hamamatsu Photonics K. K, pp. 1-43 (2004).
A. Rogaiskl (Journal of Applied Physics, vol. 93, No. 8, 15, pp. 4355-4391 (2003).
Green, M.A., et al., "Very High Efficiency Silicon Solar Cells—Science and Technology," IEEE Transactions on Electron Devices, vol. 46, No. 10, pp. 1940-1947 (1999).
Campbell, P., et al., "Light Trapping Properties of Pyramidally Textured Surfaces," J. Appl. Phys., vol. 62.1, American Institute of Physics, pp. 243-249 (1987).
Brendel, R., at al.,"Ultrathin crystalline silicon solar cells on glass substrates," Applied Physics Letters, vol. 70, No. 3, pp. 390-392 (1997).
Swanson, R. M., et al. "Point-contact silicon solar cells," IEEE Transactions on Electron Devices, vol. ED-31, No. 5, pp. 661-664 (1984).
Sinton, R.A., et al., "27.5 percent silicon concentrator solar cells," IEEE Electron Device Letters, vol. EDL-7 No. 10, pp. 567-569 (1986).
Yuan, H.,et al. "FPA Development: from InGaAs, InSb to HgCdTe," Proceedings of SPIE vol. 6940, paper 69403C, (2008).
Ashley, T., et al., "Epitaxial InSb for elevated temperature operation of large IR focal plane arrays," Proceedings of SPIE vol. 5074, pp. 95-102 2003).
Zhao et al. "A 19.8% efficiency honeycomb multicrystalline silicon solar cell with . . . ," IEEE Transactions on Electron Devices, vol. 46, No. 10, pp. 1978-1983 (1999).
Kayes, B. M., et al., "Comparison of the device physics principles of planar and radial p-n. junction nanorod . . . " J. Appl. Physics, vol. 97, pp. 114302 (2005).
Hu, L,, et al., "Analysis of Optical Absorption in Silicon Nanorwlre Arrays for Photovoltaic Applications," Nano Letters, vol. 7, No. 11, p. 3249 (2007).
Klipstein, P., "XBn barrier photodetector for high sensitivity and high operating temperature infrared . . . ," Proceedings of SPIE, vol. 6940, paper 69402U-1 (2008).

* cited by examiner

DUAL-BAND DETECTOR ARRAY

CROSS REFERENCE TO RELATED APPLICATIONS

This application claims the benefit of U.S. Provisional Application No. 61/792,328, filed on Mar. 15, 2013, which is incorporated herein by reference in its entirety.

FIELD

The present invention relates to dual-band detector arrays.

BACKGROUND

Most prior detectors of infrared imagers have pixels whose lateral spatial extent is defined by etching mesa structures whose sidewalls extend through the light absorbing layer. An example of a widely used dual-band detector structure is shown in FIGS. 1a-b. In this structure, the light absorbing regions for the two wavelength bands are stacked directly above each other and both of these light-absorbing layers are located completely within the same mesa as described by G. Destefanis, et al., "Bi-color and dual-band HgCdTe infrared focal plane arrays at DEFIR," Proceedings SPIE Vol. 6206, 2006, p. 62060R, which is incorporated herein by reference in its entirety. Each pixel consists of two back-to-back photodiodes, with those diodes having, for example, N-on-P configurations. Each pixel has one independent contact and also has a contact that is common to the other pixels of the array. In general, the light-absorbing layer that absorbs the shorter-wavelength light is located closer to the incident light, which is the layer located closer to the substrate in the case shown in the figure. The two photodiodes of a pixel are electrically contacted and biased through the single contact located on the top of the mesa and through the array-common contact located on the substrate side of the structure. By switching the bias voltage for a pixel from a positive value to a negative value, it is possible to extract the photo-detected signal from one or the other P/N junction photodiode of a back-to-back pair.

The bias switched pixels can detect only one band at a time. Thus, the images for the two bands can be spatially offset from each other if the platform carrying the imager is moving rapidly compared to the switching speed for the band selection. Likewise, if an object being imaged is moving rapidly, the images formed for the two bands may indicate different spatial locations for that object. A dual-band imager that can provide outputs at both bands simultaneously is desirable for avoiding such image and/or object shifts.

FIG. 3 shows the cross-section structure and the material energy-band structure of another prior dual-band detector that has two outputs for each pixel as described by M. B. Reine, et al., "Simultaneous MW/LW dual-band MOVPE HgCdTe 64×64 FPAs," Proceedings SPIE Volume 3379 (April 1998), pp. 200-212, which is incorporated herein by reference in its entirety. For this detector, the light-absorbing regions for the two wavelength bands are located within the same etched mesa and are aligned directly over each other. This detector is fabricated from a four-layer P-n-N-P structure, with an additional potential barrier for holes located at the n-N interface. In this structure, the longer-wavelength signal is obtained from one of the contacts for each pixel. However, the shorter-wavelength signal is obtained from the array common output. The other pixel-specific output provides the electron currents for both the longer wavelength and the shorter wavelength bands. Thus, a more complicated ROIC input circuit is needed to separate the signal currents for the two bands. There is a need for a compact dual-band detector that can simultaneously provide two outputs per pixel with those two outputs directly being the photo-currents for the two wavelength bands.

FIGS. 4a-c show the cross-section structure and the material energy-band structure of a prior detector that has aligned absorber regions for the two wavelength bands and also that can provide the photo-currents for those two wavelength bands at each detector pixel. This detector actually contains three mesas (as illustrated in FIGS. 4a-b) whose sidewalls extend completely through the longer-wavelength absorber layer of the structure as described in K. Kosai, et al., "Integrated LPE-grown structure for simultaneous detection of infrared radiation in two bands," U.S. Pat. No. 5,559,336, issued 24 Sep. 1996, which is incorporated herein by reference in its entirety. These mesas enable the outputs of each pixel to be presented via three coplanar solder bumps to a readout circuit. One output is coupled to the collector layer that collects the photo-generated electrons from the longer-wavelength absorber layer. Another output is electrically connected to a contact made to the shorter wavelength absorber layer. These two outputs provide the photo-currents for the two bands. A third output is electrically connected to a contact made to the longer-wavelength absorber layer and its output is the combined photo-currents for the two bands. This detector has an $N^+$-P-$P^+$-N layer structure and its electronic band structure may be like the one shown in FIG. 4c as described by K. Kosai and G. R. Chapman, "Dual-band infrared radiation detector optimized for fabrication in compositionally graded HgCdTe," U.S. Pat. No. 5,457,331, issued 10 Oct. 1995, which is incorporated herein by reference in its entirety. This band structure, which has a wide bandgap barrier to block the flow of electrons between the two light-absorbing layers, facilitates extraction of the electrons generated by absorption of the shorter-wavelength light through the second output and the extraction of the electrons generated by absorption of the longer-wavelength light through the first output. The holes generated by absorption of both the shorter-wavelength and the longer-wavelength light are extracted through the third output. A weakness of this prior detector is that with its three large mesas and thick absorber layers, the size of a pixel is likely 50 µm or larger. Thus, there remains a need to achieve a photo-detector array with simultaneous dual-band output that has sufficiently small pixel pitch to enable large-format imagers. Also, there is no provision for achieving a contact common to multiple pixels that can output a current due to both light-absorbing regions. That contact whose output is a current due to both light-absorbing regions would need to be made to the longer-wavelength light-absorbing layer, but the mesas form completely separated regions of the longer-wavelength absorber for each pixel and thus a contact common to multiple pixels cannot be made with this prior approach.

FIGS. 2a-b show the cross-sectional structure of a prior art dual-band detector in which each diode detector of a given pixel has a separate electrical contact, thereby allowing true simultaneous detection of light in the two wavelength bands, as described by P. Tribolet, et al., "Advanced HgCdTe technologies and dual-band developments," Proceedings SPIE Volume 6940, paper 69402P, (2008) which is incorporated herein by reference in its entirety. For this prior structure, the lateral spatial extent of each pixel is defined not by an etched mesa but rather by a pair of PN junctions formed as a result of ion implantation. This known structure comprises a layer having wider bandgap material (the NIR barrier) located between the two light-absorbing layers that prevents electrical short-circuiting between the two diodes. This barrier blocks both the electrons and the holes. In this structure, the longer-wavelength absorbing layer (the LWIR or band-2 absorber) and the shorter-wavelength absorbing layer (the MWIR or band-1 absorber) are laterally contiguous and extend over multiple pixels. A deep via hole is etched through portions of the LWIR absorber layer in order to permit electrical contacts to be made to the PN junction for the MWIR absorber layer. In order to make contact for the return path of both diodes, the array also has other electrical contacts, located at the edge of the array, that abut both the shorter-wavelength absorbing layer and the longer-wavelength absorbing layer as shown in FIG. 2a. One weakness of this detector is that in each pixel of this detector, the detecting regions for the two bands are defined by the locations of the PN junctions for its two absorber layers. Since those two PN junctions are slightly offset from each other, as illustrated in FIG. 2b, the detections regions for the two bands also are offset from each other. This approach can achieve a pixel pitch as small as 20 µm, albeit with a small, fixed offset between the pixels for the two bands. This offset results in an undesirable spatial offset in the images produced for the two wavelength bands.

The prior dual-band detector arrays have generally been operated and tested at a device temperature of 77K. At this temperature, the dark-current noise is determined primarily by the thermal generation processes in the carrier-depleted junctions of the device. There is a need to achieve detectors that can operate at higher temperatures, such as 130-150K or even approaching 200K, and still have background limited noise performance. At these higher device temperatures, the thermal generation of carriers in the light-absorbing regions, especially for the longer-wavelength band, also can contribute to or even can dominate the dark-current noise. As a result, there is a need to reduce the volume of the longer-wavelength absorber material as well as reduce the depleted junction regions and still achieve high quantum efficiency for conversion from incident photons to output electrical carriers.

FIG. 5 shows a single band detector (albeit having very wide bandwidth) that can achieve high quantum efficiency with a reduced volume of its light-absorbing material. This detector contains multiple pyramid shaped features formed in each pixel, with those pyramids located on the side of the detector facing the incident light as described by D. Yap, et al., "Wide bandwidth infrared detector and imager," U.S. Pat. No. 7,928,389, issued 19 Apr. 2011, which is incorporated herein by reference in its entirety. The pyramids are etched into a moderately thin light absorbing layer, with the overall thickness of that light-absorbing layer being roughly equal to the longest wavelength of the light to be absorbed. The pyramids are etched only partly through the light-absorbing layer so that there remains a physically continuous base region of the light-absorbing layer to permit the majority carriers to be conducted to electrical contacts formed at the edges of the detector array. This detector also contains mesas etched through the heavily doped collector or extractor layer of the P/N diode. The mesas are not etched into the main light-absorbing layer and the mesas face away from the incident light. The pixel-specific electrical contact for a given pixel is formed onto these collector mesas. The spatial extent of a given pixel is defined by the electrical contact made to these mesas. There can be more than one mesa for each pixel and there are multiple pyramids in each pixel.

For this detector, the light is incident from the side containing the pyramids rather than from the substrate side of the detector. Thus, the detector in FIG. 5 is unlike the prior detectors illustrated in FIGS. 1-4. Furthermore, the pyramid-shaped regions of the light-absorbing layer do not specifically define the extent of a pixel but rather they extend throughout the light-facing surface of the array. Instead, the pixel is defined by the extent of the electrical contacts made to the one or more collector mesas comprising a pixel and the electrical interconnection of those contacts. The electrical contact made to the light-absorbing layer of this structure is the common contact of the detector array.

FIG. 6 shows another single band detector (likewise having very wide bandwidth) that has only a thin layer of light-absorbing material. This detector contains multiple pyramid shaped features formed in each pixel, with those pyramids being transparent to the wavelengths of light to be absorbed as described by D. Yap and R. D. Rajavel, in U.S. application Ser. No. 13/372,366 "Wideband detector structures," Filed on Feb. 13, 2012, which is incorporated herein by reference in its entirety. Those pyramids are located on the side of the detector facing the incident light. The pyramids are located above the thin and laterally continuous light absorbing layer. Although the thickness of the light-absorbing layer is much less than the 1/e absorption length for that material, it is possible to achieve quantum efficiency well above 80% over the entire wide bandwidth sensed by this detector. Deep dips in the absorption spectrum, at which wavelengths the absorption is greatly reduced, are avoided by forming multi-stepped mesas of the collector regions and/or oxide spacers of various thickness that separate the light-absorbing layer from a metal reflector at the backside of the device.

FIG. 7 shows a dual-band detector that has a reduced volume of the light-absorbing material for the longer-wavelength band as described in U.S. application Ser. No. 13/37036,403 "Infrared Detector," Filed on Feb. 28, 2011, which is incorporated herein by reference in its entirety. Light is incident from the substrate side of that device, which is illustrated in FIG. 7. For that detector, the growth substrate is preferably thinned but does not need to be removed completely. Pyramids are formed in the thinned substrate and they serve to improve the coupling of light into the light absorbing regions. The light absorbing regions for the longer-wavelength band are laterally separated from each other and are surrounded by voids that may be filled with a transparent, low-refractive-index material. A metal reflector at the backside of the detector acts in combination with these trapezoidal shaped light-absorbing regions to achieve efficient trapping and absorption of the light. The light-absorbing region for the shorter-wavelength band is a laterally contiguous layer. This prior detector has a single electrical output per pixel as well as an array common output. Thus, the dual-band operation is achieved by switching the bias voltage applied to a detector pixel.

Most of the prior dual-band detectors have a separate PN diode for detecting the light of each band, with a wide bandgap barrier that electrically isolates these two PN diodes by blocking the flow of both electrons and holes (as shown in FIGS. 2 and 4). Such back-to-back PN diode configurations result in devices that require much larger area. The dual-band detector shown in FIG. 7, and also the prior detector shown in FIG. 3, has a barrier between the two light-absorbing regions for the two bands, with that barrier blocking one electrical carrier but not the other carrier. These prior detectors essentially have one electrical output that provides the signal for one band and a second electrical output that provides a combined signal for both bands. This configuration requires a more complicated front-end circuit for the read out.

In view of the limitation in prior art, a need exists for improved detectors.

Figure 1A:
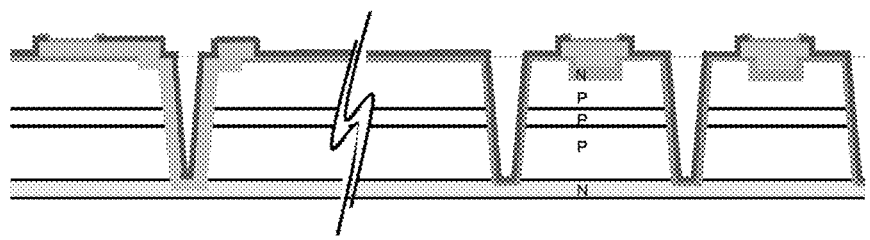
FIGS. 1a-b depict a detector known in the art.
Figure 1B:
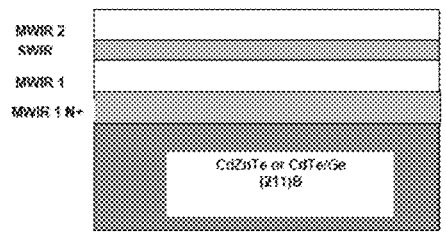

In the following description, like reference numbers are used to identify like elements. Furthermore, the drawings are intended to illustrate major features of exemplary embodiments in a diagrammatic manner. The drawings are not intended to depict every feature of every implementation nor relative dimensions of the depicted elements, and are not drawn to scale.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Unlike the prior detectors, in one embodiment, the presently disclosed detectors comprise two barriers abutting the two light-absorbing materials for the two wavelength bands. One of these barriers selectively blocks the flow of holes and also permits only uni-directional flow of electrons. The other barrier selectively blocks electrons and does not block holes. By having these two carrier-selective barriers, in one embodiment, the presently disclosed detectors can simultaneously provide two signal outputs for each pixel, with each output being the signal for a different band. The combined signal for both bands is then obtained at a third output that is common for multiple pixels. As a result, the electrical front-end circuit for the new detector can be much simpler. The two, separate barriers also are designed to minimize the volume of the depletion regions formed in the two light-absorbing layers.

In some embodiments, the presently disclosed array of area-efficient photo-detectors for a dual-band infrared focal-plane array imager can have more than 1000×1000 pixels. The photo-detectors can be more compact than prior dual-band photo-detectors because they require only a thin layer of light-absorbing material for the longer-wavelength band and still can achieve high absorption efficiency. In some embodiments, the thickness of the light-absorbing material for the longer-wavelength band is smaller than the wavelengths of light in that longer-wavelength band and could be smaller than one-half the wavelengths of light in that longer-wavelength band. The presently disclosed detectors use small-area, metal-filled via holes to electrically constrain the boundaries of a pixel as well as to electrically contact the light-absorbing layer for the shorter-wavelength band and connect its output to bond pads. The presently disclosed embodiments of photo-detectors may also use collector regions, whose overall area, as determined by their width or diameter, is much smaller than the photo-detector area, as determine by the width or other lateral dimension of the photo-detector pixel, both to electrically constrain the boundaries of a pixel as well as to extract the photo-generated minority carriers from the light-absorbing layer for the longer-wavelength band and connect that output to other bond pads. Both the smaller-area collector regions and the metal-filled via holes can fit within the area of a photo-detector pixel and they are located directly beneath the solder-bump bond pads of that pixel.

The presently disclosed detectors may comprise pyramid-shaped features located on the side of the detectors facing the incident light to provide broad-band anti-reflection. The metal bond pads and metal interconnects between the metal-filled via holes and the dielectric material around them also serve as multi-stepped optical reflectors located on the side of the detectors away from the incident light. In combination with the pyramids, these multi-stepped reflectors facilitate the capture and absorption of light in the first and second light-absorbing layers, enabling the thickness of those layers to be much smaller than ones in prior detectors. Because the volume of the longer-wavelength light-absorbing material is so small, the noise resulting from thermal generation processes that occur in the bulk of that absorber may be reduced sufficiently to enable the array to operate at non-cryogenic temperatures. Unlike the longer-wavelength absorber of prior dual-band detector arrays, this thin absorber layer is laterally contiguous and has low resistance, and it also serves to conduct the combined photo-currents of both bands from multiple detectors to the common contacts, which could be formed at the perimeter of an array or at the perimeter of groups of one or more pixels.

In some embodiments, for each pixel, the light absorbing regions that detect the two wavelength bands are aligned directly above each other, so there is no physical offset between the images for the two bands. The detectors of this array have first light-absorbing regions of a first light-absorbing material and a second light-absorbing layer of a second light-absorbing material. The first light-absorbing regions are located between the side of the photo-detector array that faces the incident light and the second light-absorbing layer. Thus, the incident light to be absorbed by the second light-absorbing layer must first pass through the first light-absorbing regions. The absorption cutoff wavelength of the first light-absorbing material is shorter than the absorption cutoff wavelength of the second material. The absorption cutoff wavelength of the first light-absorbing material is shorter than the absorption cutoff wavelength of the second material. Thus, the first light-absorbing material is transparent to the primary wavelengths of the light absorbed by the second light-absorbing layer. The detectors also have collector regions that are located on the side of the second light-absorbing layer facing away from the incident light, and the side of the second light-absorbing layer opposite the side facing the first light-absorbing regions. Unlike prior detectors, these collector regions preferably are transparent to the light of the two wavelength bands. The overall area of the collector regions associated with a given photo-detector is significantly smaller than the area of the photo-detector. The reduced area of the collector regions results in reduced dark current from generation/recombination processes that occur in the depletion regions of the second light-absorbing layer.

In some embodiments, the array of photo-detectors presently disclosed contains two carrier-selective barriers that direct the photo-generated carriers resulting from light in a first wavelength band that is absorbed by first light-absorbing regions to a set of first electrical contacts and direct the photo-generated carriers resulting from light in a second wavelength band that is absorbed by second light-absorbing layer to a set of second electrical contacts. The first barrier is located between the first light absorbing regions and the second light absorbing layer. That first barrier passes a first type of electrical carrier (e.g., electrons) photo-generated in the first light-absorbing regions but blocks a second type of electrical carrier (e.g., holes) photo-generated in the first light-absorbing regions. Also, this first barrier blocks both carrier types (i.e., both holes and electrons) photo-generated in the second light-absorbing layer. The second barrier is located between the second light-absorbing layer and the collector regions. That second barrier passes the second type of electrical carrier (e.g., holes) and blocks the first type of electrical carrier (e.g., electrons) photo-generated in the second light-absorbing layer. The first and the second barriers preferably are designed to minimize the depletion regions that may be formed in the first light-absorbing regions and in the second light-absorbing layer adjacent to those barriers.

Each photo-detector, with a photo-detector corresponding to a particular dual-band pixel of the image, may simultaneously detect the portions of the incident light that are in the two wavelength bands and provide two output photo-currents corresponding to that detected light. One output of each pixel provides the photo-current signal for the shorter-wavelength band and the other output provides a photo-current signal for the longer-wavelength band. The array also has a third output, which is common to multiple pixels or even to the entire array. This third output is the return port for the photo-currents of both bands. Each detector has one or more first electrical contacts to the first light-absorbing regions and one or more second electrical contacts to the collector regions. Both the first and second electrical contacts are local to their specific detector pixel. The first contacts output the hole-current signal for the first wavelength band. The second contacts output the hole-current signal for the second wavelength band. The array also has one or more third electrical contacts, common to multiple pixels, that contact to the second light-absorbing layer. The third contacts output the combined electron-current signals for both wavelength bands. The second light-absorbing layer is laterally contiguous and extends over more than one detector pixel. This layer provides a path for conducting carriers photo-generated in both the first and the second light-absorbing materials to those third electrical contacts.

In some embodiments, the photo-detectors presently disclosed have a first set of metal posts or metal-filled vias that abut and electrically contact the first electrical contacts. That first set of metal posts or metal-filled vias occupies voids formed in the second light-absorbing layer. The photo-detectors also can include another set of metal posts or metal-filled vias that abut and electrically contact the third electrical contacts, which may be common to multiple pixels. That other set of metal posts or metal-filled vias are located in the spaces between the collector regions. The various metal posts or metal-filled vias are further connected to bond pads and those metal posts or metal-filled vias have heights that are designed such that the levels of the bond pads to which they are connected as well as the level of the bond pads to which the electrical contacts for the collector regions are connected are approximately co-planar. The result is a relatively planar set of electrical bond pads for interfacing to the read-out integrated circuit (ROIC) of the imager. The detector array can also include chip-to-chip bumps, such as solder bumps, that are connected to the bond pads. Those chip-to-chip bumps electrically connect the detector array chip to an electronic ROIC chip that is located on the side of the detector away from the incident light. Since the electrical interconnections from the various contacts to the bond pads are vertical, made by means of metal posts or metal-filled vias, the minimum size of the photo-detectors can be constrained by the minimum sizes of the bond pads and solder bumps themselves rather than by the space occupied by the electrical interconnection lines, unlike prior detectors.

In some embodiments, the first light-absorbing regions include light-absorbing pyramid-shaped structures that are located on the side of the detector facing the incident light. These absorbing pyramids absorb the light of the shorter-wavelength band but are transparent to the light of the longer-wavelength band. In another embodiment, the detectors further include transparent pyramid-shaped structures that are located on the side of the detector facing the incident light and that abut the first light-absorbing regions. Those transparent pyramids comprise a wide bandgap, high refractive index material. In another embodiment, the detectors can further contain regions of low refractive-index, dielectric material that fills spaces between the collector regions, that are in the voids formed in the second light-absorbing layer or that separate the metal interconnect lines from the metal bond pads. In some embodiments, these dielectric regions are part of a multi-stepped relief pattern that, in combination with the metal reflectors formed on that relief pattern, facilitates the trapping of the incident light in the detectors to increase their absorption efficiency.

In some embodiments, photo-detectors presently disclosed have one or more collector regions. In some embodiments, the photo-detector presently disclosed comprises at least one collector region located near the center of the photo-detector. In some embodiments, the photo-detector presently disclosed comprises multiple, separate collector regions. In some embodiments, the locations of these multiple collector regions are aligned beneath the centers of the pyramid-shaped structures and away from the edges and corners of the pyramid-shaped structures.

In some embodiments, the small-size photo-detectors of the disclosed photo-detector array make possible a dual-band, large format, area-efficient infrared imager that can simultaneously detect and distinguish between light in two different wavelength bands. When such a photo-detector array is used in an optical imager, the images at those two bands are captured simultaneously because each photo-detecting pixel has electrical outputs corresponding to each of the two bands. Also, the images at those two bands are spatially registered with each other because the light-absorbing materials for the two bands are physically aligned to each other. The read-out circuit can integrate and process the photo-current signals for both bands separately. Alternatively, the read-out circuit can switch between the output photo-current of each band and integrate one output at a time. In one embodiment, the present detectors provide both photo-currents and only the input stage of the read-out circuit is switched. This provides the designer of the read-out circuit with greater flexibility.

In some embodiments, the photo-detectors of the disclosed photo-detector array have reduced volume of the photon-absorber material because the first and second light-absorbing regions are thin and they also may have areas in which their light-absorbing material has been removed. Thus, the photo-detectors can achieve reduced dark current (and improved noise performance) at temperatures higher than typical cryogenic temperatures (e.g., at temperatures of 130-200K, depending on the cut-off wavelength of its light-absorbing material).

In some embodiments, the vertically aligned regions of the presently disclosed photo-detectors allow the size of the pixel to be smaller than what has been achieved with other dual-band detectors having simultaneous outputs of the signals for those two bands. The two carrier-selective and directional barriers and the laterally contiguous second light-absorbing layer are the innovative features of the presently disclosed photo-detectors that allow the signals for the two bands to be presented directly at the two separate outputs of each pixel. This enables the read-out circuit for each pixel to be simpler than the read-out circuits of previous dual-band detectors that simultaneously output the signal for only one wavelength band plus a mixed dual-band signal from each detector pixel. The compact structure of the presently disclosed detectors, with the metal-filled via holes and the vertically aligned bond pads, makes possible arrays having the small pixel-to-pixel pitch required for large format (e.g., 1000×1000 pixel) imagers.

Many high-sensitivity focal-plane photo-detector arrays for detecting light at mid-wave infrared (MWIR) wavelengths or longer need to be cooled to cryogenic temperatures (e.g., 77 K and lower) in order to sufficiently reduce their internally produced noise current to levels that are below the background noise of the scene. However, cryogenic coolers, such as Stirling coolers, are bulky and they involve moving parts that can reduce the reliability of the overall system. If the operating temperature of the detector array can be increased to 200 K and higher, it approaches the range of temperatures that can be attained by thermoelectric (TE) coolers that do not involve moving parts. If the operating temperature can be increased even to 150 K, it can be cooled by radiative means for imagers used in space. Thus, there is a need for infrared detector arrays that can operate with low noise current at temperatures of 150 K and higher.

The noise current of an un-illuminated infrared detector, or its dark current, has several major components. One component is a generation/recombination current (G/R current) that limited by G/R centers at material interfaces such a homojunctions or heterojunctions in the detector. Another component is a diffusion current that, for high quality materials, is limited by thermal generation in the bulk of the light-absorber material. Yet another component is a surface-recombination current due to interface electronic states resulting from un-passivated dangling chemical-bonds at the outer boundaries of the detector semiconductor material. For many common infrared detector materials, such as HgCdTe and antimony-based compounds, the G/R current typically dominates the dark current at low temperatures, such as below 120-150K. However, at higher temperatures, the diffusion current and the thermal generation within the bulk absorber regions dominate the dark current. This diffusion current is especially significant for the longer-wavelength absorber material, which has a smaller energy bandgap.

One way to reduce the diffusion current at the higher operating temperatures is to reduce the volume of the absorber material. However, this reduction of absorber volume typically also results in a reduction of the photon absorption efficiency or quantum efficiency of the infrared detector. The disclosed detector achieves both reduced diffusion current as well as high quantum efficiency to permit operation at higher temperatures. The reduced diffusion current is accomplished by reducing the volume of absorber material, for a given input cross-sectional area of detector array or, alternatively, a given pixel area. The high quantum efficiency is achieved by using geometrical features that greatly reduce the net front-side reflection of the incident light and also that trap the incident light such that the light makes multiple passes through the absorber regions.

In some embodiments, a dual-band detector presently disclosed maximizes the absorption of the light of the shorter-wavelength band by the first light-absorbing region and minimizes or essentially eliminates the absorption of that shorter-wavelength light by the second light-absorbing region. This minimizes the crosstalk between the detected signals for the two bands. In one embodiment, a dual-band detector provides an absorption spectrum that is essentially flat at some maximum value over each of the two bands, to maximize the quantum efficiencies of the detector. In one embodiment, a dual-band detector minimizes the front-side reflection of the detector so that more of the incident light is coupled into the light-absorbing regions rather than being reflected from the structure.

Figure 8:
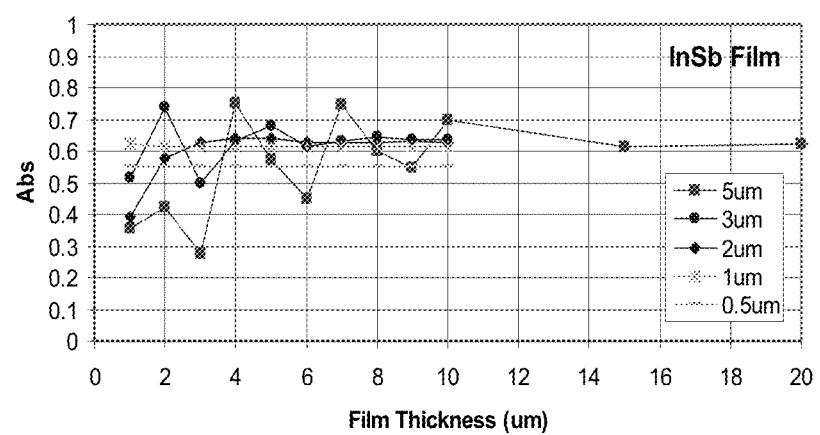
FIG. 8 depicts dependence of the absorbance of a uniform-thickness absorbing layer on the layer thickness and the wavelength of the incident light.

FIG. 8 shows results from calculations of the absorbance (normalized absorption) of a presently disclosed detector(s) comprising a uniform thickness of MWIR absorbing material. These calculations assumed an InSb light-absorbing material but the disclosed detector array actually may comprise any light absorbing material that absorbs light at the desired range of wavelengths for its two detection bands. The results indicate that the thickness of the absorbing layer should be at least twice the wavelength of the incident light in order to achieve maximum broadband absorbance. For thinner absorbing layers, there are strong oscillations in the dependence of absorbance on layer thickness that can be associated with multi-pass optical cavity effects (Fabry-Perot cavity resonances). These oscillations arise because the high refractive index of InSb causes the InSb-to-air interface at the front side of the layer to have high reflection. Since it is desirable to reduce the volume of absorber material, a typical prior detector could have a metal reflector located at the side of the detector opposite the incident light. The combination of the metal backside reflector and the reflectance from the front-side of the InSb layer establishes the Fabry-Perot cavity. The results in FIG. 8 also show that the absorbance obtained for very thick layers of absorber approaches a value of approximately 0.6. This low absorbance is due to the front-surface reflection of the light, since the refractive index of the absorber material is much larger than 1. Many prior detectors have anti-reflection (AR) coatings that comprise one or more layers of dielectric films that have the desired combination of film thickness and refractive index to achieve reduced reflection over the broader range of wavelengths needed for dual-band operation. However, this reduced reflection still generally exceeds 1-2%. Thus, there is a need for a way to achieve even lower front-side reflection (<1%) over the SWIR-to-MWIR or MWIR-to-LWIR bands.

Figure 9:
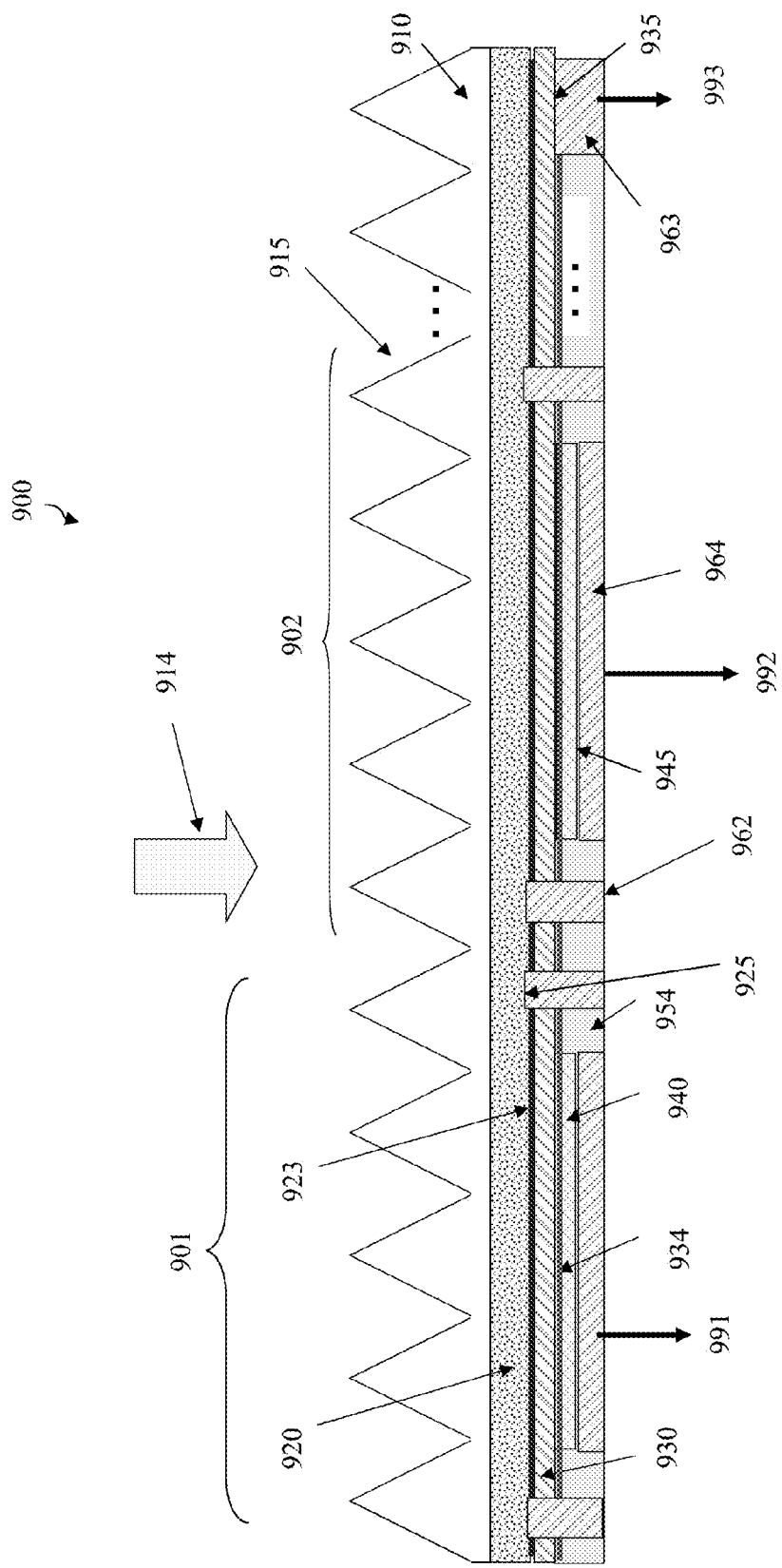
FIG. 9 depicts an embodiment of a detector according to the present disclosure.

In some embodiments, a detector array 900 configured to absorb incident light 914 according to the present disclosure is shown in FIG. 9. The detector array 900 comprises two detector pixels 901, 902. In some embodiments, the detector array 900 comprises a first electrical output 991 associated with the pixel 901, a second electrical output 992 associated with the pixel 902, and a third electrical output 993 that is common to both pixels 901, 902.

Although present figures and descriptions disclose a two-band detector that absorbs incident light 914 of two bands (e.g., band-1 and band-2) that are both at mid-wavelength infrared (MWIR) wavelengths (i.e., MWIR1 and MWIR2), it is to be understood that some of the presently disclosed embodiments can be configured to detect short-wavelength infrared (SWIR) (for band-1) and MWIR (for band-2) wavelengths. Alternatively, some of the presently disclosed embodiments can be configured to detect MWIR (for band-1) and long-wavelength infrared (LWIR) (for band-2) bands. According to the convention adopted in the present descriptions, the shorter-wavelength band detected is considered band-1 and the longer-wavelength band detected is considered band-2.

Referring to FIG. 9, in some embodiments, the detector array 900 comprises a first layer 920 of material configured to absorb incident light 914 in the shorter-wavelength band (e.g., MWIR1) and a second layer 930 of material configured to absorb incident light 914 in the longer-wavelength band (e.g., MWIR2). The specific bands absorbed depend on the cut-off wavelength of the absorption spectra for the two light-absorbing materials 920 and 930. In some embodiments, the first layer 920 comprises GaInAsSb material with a cut-off wavelength for example, between 2.5 and 3.5 μm that can be designed according to the specific material composition selected. In some embodiments, the second layer 930 comprises an InAsSb material that has a cut-off wavelength, for example, of about 4.9 μm at a temperature of 150K. In some embodiments, the first layer 920 is lightly doped p-type material and the second layer is lightly doped n-type material. In one embodiment, the first layer 920 is disposed closer to the incident light 914 than the second layer 930. In this embodiment, the incident light first passes through the first layer 920 before reaching the second layer 930. The shorter-wavelength components of the incident light 914 are absorbed primarily by the first light-absorbing layer 920. However, the longer-wavelength components of the incident light 914 are not absorbed by the first layer 920 but are transmitted through the layer 920 to the second layer 930.

Figure 10:
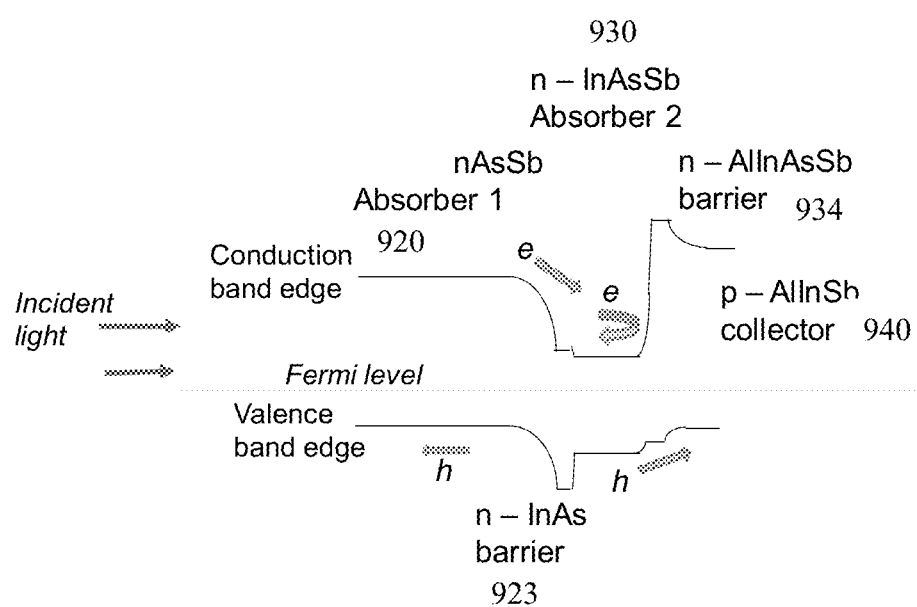
FIG. 10 depicts an energy band structure according to the present disclosure.

In some embodiments, the detector array 900 comprises a collector layer 940 that is located on the side of the second absorber layer 930 opposite the incident light (and also opposite the first absorber layer 920). In one embodiment, the collector layer 940 comprises material similar to the one used for the second absorber layer 930 so that it also absorbs the MWIR2 band light. In another embodiment, the collector layer 940 comprises material such as GaAlSb, GaAlAsSb or GaInAsSb that has a sufficiently wide electronic bandgap that the collector layer 940 is transparent to the MWIR2 band light and transparent to the MWIR1 band light. In some embodiments, the collector layer 940 comprises material with an energy band alignment that facilitates flow of holes from the MWIR2 band absorber 930 to the collector layer 940 but blocks the flow of electrons from the MWIR2 band absorber 930, as illustrated in FIG. 10. In some embodiments, the collector layer 940 comprises material that is heavily doped to facilitate the fabrication of ohmic contacts to that material.

In some embodiments, the detector array 900 comprises a first carrier-selective barrier layer 923 disposed between the first light-absorbing layer 920 and the second light-absorbing layer 930. In some embodiments, the first carrier-selective barrier layer 923 is designed to block the flow of holes between the first light-absorbing layer 920 and the second light-absorbing layer 930, as illustrated in FIG. 10. In some embodiments, the first carrier-selective barrier layer 923 is designed to permit the flow of electrons from the first light absorbing layer 920 to the second light-absorbing layer 930 and designed to block the flow of electrons in the opposite direction, from the second light-absorbing layer 930 to the first light-absorbing layer 920, as illustrated in FIG. 10. As a result, photo-generated minority carriers (i.e., electrons) produced in the first light-absorbing layer 920 from absorption of the MWIR1 band light pass through the first carrier-selective barrier layer 923 to the second light-absorbing layer 930 to be collected. The photo-generated majority carriers (i.e., holes) produced in the first light-absorbing layer 920 remain in that layer, because of the first carrier-selective barrier layer 923 and are conducted to the electrical contacts 925. In some embodiments, the first carrier-selective barrier layer 923 is formed by placing a thin layer of wide bandgap material between the first and second light-absorbing materials 920, 930 and by properly selecting the materials and doping levels used for first carrier-selective barrier 923 and for the two light-absorbing layers 920, 930. A GaInAsSb material of suitable p-doping and cutoff wavelength for absorbing the band-1 wavelengths and an InAsSb material of suitable n-doping and cutoff wavelength for absorbing the band-2 wavelengths is one possible combination of materials for the two light-absorbing layers 920, 930. Possible materials for the first carrier-selective barrier 923 include AlInAsSb and/or InAs, Referring to FIG. 10, which illustrates the energy-band diagram of one embodiment of the material structure of the detector array 900, the first light-absorbing layer 920 can comprise p-type GaInAsSb material and the second light-absorbing layer 930 can comprise n-type InAsSb material. The collector layer 940 can comprise a p-type AlInSb material for which the energy of its valence-band edge is higher than the energy of the valence-band edge of the material comprising the second light-absorbing layer. Thus, holes in the second light-absorbing layer can flow into the collector. However, for this embodiment, the energy of the conduction-band edge of the collector material is higher than the energy of the conduction-band edge of the material of the second light-absorbing layer. Thus, electrons in the second light-absorbing layer 930 remain in that layer instead of flowing into the collector layer 940. The material (n-type InAsSb is depicted in the figure) of the second carrier-selective barrier 934 is selected to have its valence-band edge not hinder the flow of holes from the second light-absorbing layer into the collector layer. However, the conduction-band edge of the material of that second carrier-selective barrier 934 preferably is at a sufficiently high energy that electron flow between the second light-absorbing layer and the collector layer is essentially blocked. The valence-band edge of the InAs material of the first carrier-selective barrier 923 is lower in energy than the valence-band edge of the materials in the two light-absorbing layers 920 and 930. This valence-band energy barrier hinders or preferably essentially blocks flow of photo-generated holes or thermally generated holes between those two light-absorbing layers.

Thus, in operation, the photo-generated holes of the first light-absorbing layer 920, which are majority carriers, can produce a current at the one or more electrical contacts 925 of the first light-absorbing layer. The photo-generate electrons of the first light-absorbing layer can flow past the first carrier-selective barrier 923 and into the second light-absorbing layer 930. The photo-generate holes of the second light-absorbing layer 930 can flow through the second carrier-selective barrier 934 and into the collector layer 940. These holes, which are majority carriers in the collector 940, can produce a current at the one or more electrical contacts 945 of the collector. The photo-generated electrons of the second light-absorbing layer 930, as well as the electrons injected into the second light-absorbing layer 930 from the first light-absorbing layer 920, are majority carriers in that second light-absorbing layer and can produce a current at the one or more electrical contacts 935 of the second light-absorbing layer 930.

In some embodiments, the photo-generated minority carriers (e.g., holes) and the photo-generated majority carriers (e.g., electrons) produced in the second light-absorbing layer 930 cannot flow into the first light-absorbing layer 920. In some embodiments, the detector array 900 comprises a second carrier-selective barrier layer 934 to facilitate the flow of holes from the second light absorbing layer 930 to the collector layer 940 while blocking the flow of electrons into the collector layer 940. As a result, photo-generated minority carriers (i.e., holes) produced in the second light-absorbing layer 930 from absorption of the MWIR2 band light pass through the second carrier-selective barrier layer 934 to the collector layer 940 to be collected and the photo-generated majority carriers (i.e., electrons) produced in the second light-absorbing layer 930 remain in that layer, confined by both barriers 923 and 934, and are conducted to the electrical contacts 935 abutting that layer. The overall result is that the photo-generated electrons for both the band-1 wavelengths and the band-2 wavelengths are essentially trapped in the second light-absorbing layer 930. In some embodiments, the detector array 900 comprises a second carrier-selective barrier layer 934 that is located between the second light-absorbing layer 930 and the collector layer 940. The second barrier layer 934 provides an even higher energy barrier to the flow of electrons and also can facilitate the flow of holes from the second light-absorbing layer 930 into the collector regions.

In some embodiments, the first barrier 923 and the second barrier 934 are designed to reduce or eliminate the depletion regions that may occur in the lightly doped or unintentionally doped first and second light-absorbing layers 920, 930. Elimination of these depletion regions is beneficial because it also eliminates the dark current arising from the generation/recombination sites in these depletion regions. U.S. application Ser. No. 13/427,387 "Dual Band SWIR/MWIR and MWIR1/MWIR2 Infrared Detectors," filed on Mar. 22, 2012, which is incorporated herein by reference in its entirety, describes some examples of designs for barrier structures suitable for n-type InAsSb, AlInAsSb, GaInAsSb, GaInSb or AlInSb absorbers.

In some embodiments, at least a portion of the second light-absorbing layer 930 is laterally contiguous and extends over multiple pixels 901 and 902. This provides a path for the majority carriers to flow through multiple detector pixels 901, 902 to a shared or common output 993. An advantage of this structure is that since the second light-absorbing layer 930 is n-type and also is composed of a material such as InAsSb that has high electron mobility, the series resistance for carrier flow through the second light-absorbing layer 930 is low, even though the second light-absorbing layer 930 is relatively thin. In some embodiments, the first light-absorbing layer 920 is also laterally contiguous over multiple pixels 901 and 902. In some embodiments, the collector layer 940 comprises one or more discrete collector regions, as depicted by the regions 1240 illustrated in FIGS. 12a-b. In some embodiments, electrical contacts 945 are made to the collector layer or regions 940 of each pixel 901, 902. Thus, each detector pixel 901, 902 has at least two electrical contacts made to it—one contact 925 associated with the first light-absorbing layer and another contact 945 associated with the collector 940. The two contacts 925 and 945 separately provide the MWIR1 signal current and the MWIR2 signal current, respectively. The common contact 935 associated with the second light-absorbing layer 930 provides a return path for those two currents.

In some embodiments of the detector array 900 presently disclosed, electrically conductive posts 962 connect the electrical contacts 925 of the first light-absorbing layer 920 to metal interconnect lines located at the backside of the array 900, opposite the side from which the light 914 is incident. In some embodiments, one or more additional electrically conductive posts 963 connect the electrical contacts 935 of the second light-absorbing layer 930 to metal interconnect lines and pads located at the backside of the array 900. In some embodiments, one or more electrically conductive posts or pads 964 or interconnect lines are connected to the one or more electrical contacts 945 of the collector layer or regions 940. In some embodiments, dielectric material 954 is located in the spaces between the conductive posts or pads 962, 963, 964.

In some embodiments, the metal layers of the contacts 925, 935 and 945 as well as the metal posts, metal interconnection lines and metal pads connected to contacts 925, 935 and 945 serve as reflectors of the incident light 914 not yet absorbed. As a result, the incident light 914 can make at least two passes through the light-absorbing materials 920, 930 of the detector array 900, thereby enhancing the absorption efficiency.

In some embodiments, the detector array 900 presently disclosed comprises an anti-reflective coating (not shown) that is formed on the side of the detector array 900 facing the incident light 914. This coating is configured to minimize the reflection of the incident light 914 in the two bands to be absorbed.

In some embodiments, the detector array 900 presently disclosed comprises pyramid-shaped features 915 that are formed on the side of the detector array 900 facing the incident light 914. These pyramidal features 915 can be etched into a layer 910 of material that is located on the incident light side of the first light-absorbing layer 920. The pyramids could be formed from a material that has a sufficiently wide bandgap to be transparent to light of both the MWIR1 and MWIR2 bands. Examples of such a material include InAlAsSb, GaAlSb and/or AlSb. Light absorbing structures with transparent pyramids are described in D. Yap and R. D. Rajavel, in U.S. application Ser. No. 13/372, 366 "Wideband detector structures," Filed on Feb. 13, 2012, which is incorporated herein by reference in its entirety.

Figure 11:
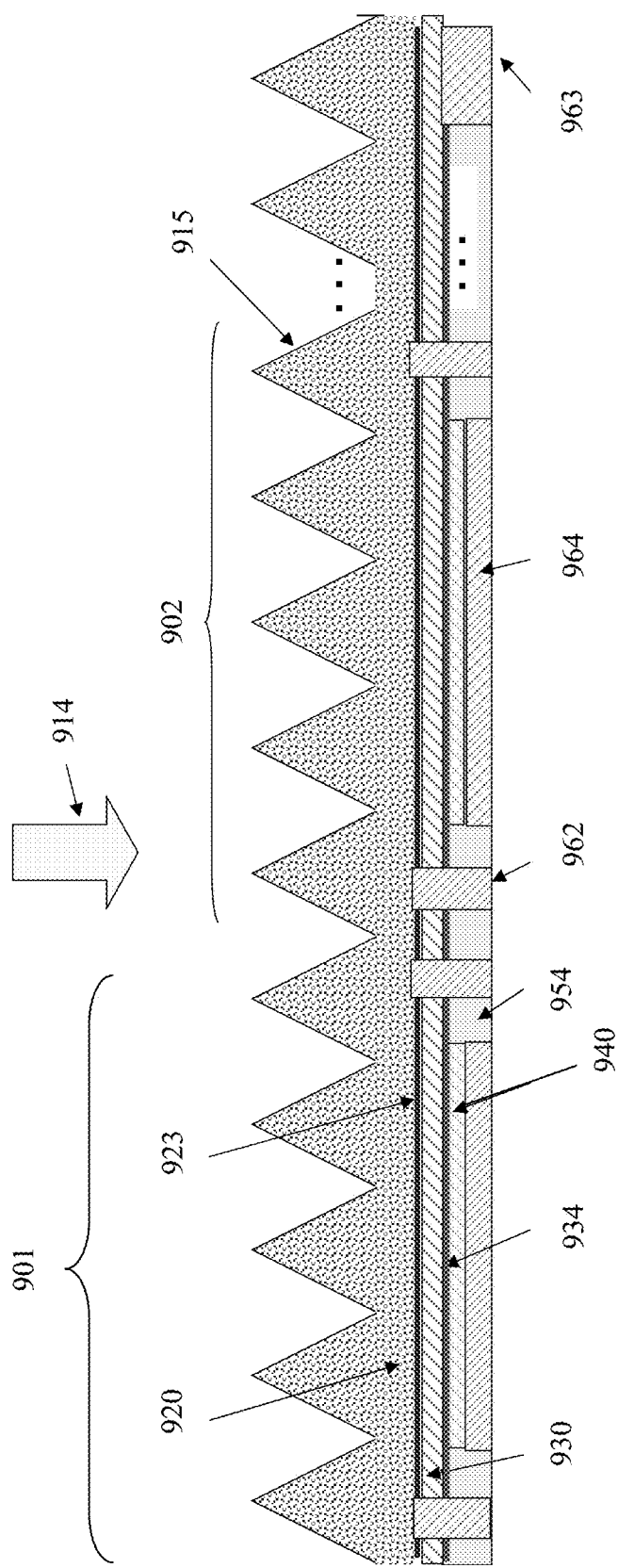
FIG. 11 depicts another embodiment of a detector according to the present disclosure.

In some embodiments, the pyramids 915 could be formed from material that is the same as the material of the first light-absorbing layer 920, as illustrated in FIG. 11. In these embodiments, the pyramids 915 may absorb the light of the MWIR1 band. Designs for such absorbing pyramids are described in U.S. Pat. No. 7,928,389 issued on Apr. 19, 2011, which is incorporated herein by reference in its entirety, and described by D. Yap and R. D. Rajavel, in U.S. application Ser. No. 13/372,366 "Wideband detector structures," filed on Feb. 13, 2012, which is incorporated herein by reference in its entirety. The pyramid-shaped structures 915, whether absorbing or transparent, may serve to reduce the front-side reflection of the incident light 914 and, for example, may achieve less than 0.5% reflection over the SWIR to MWIR range of wavelengths. Thus, the incident light 914 is transmitted into the light-absorbing layers 920, 930 of the detector array 900. In some embodiments, the pyramid-shaped structures 915 comprise material of high refractive index and they also serve to couple the incident light 914 into characteristic modes of the detector array 900 such that the incident light 914 becomes trapped in the detector array 900, essentially making multiple passes through the light-absorbing layers 920, 930. This photon-trapping effect improves the absorption efficiency of the detector array 900.

Figure 2A:
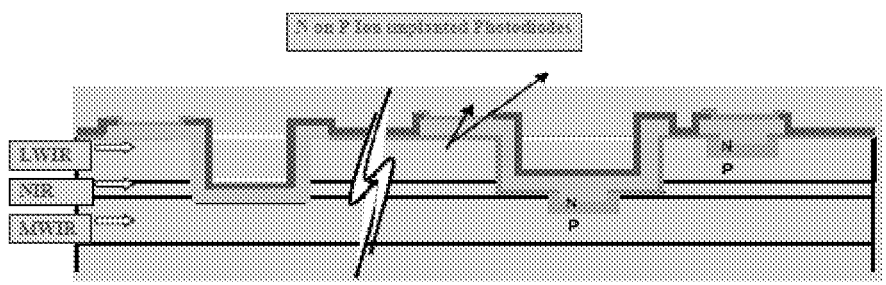
FIGS. 2a-b depict another detector known in the art.
Figure 2B:
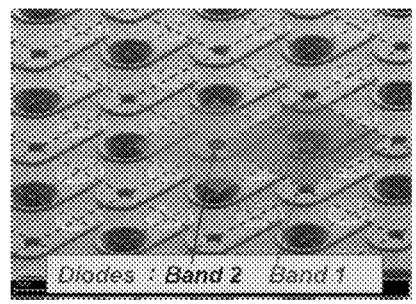
Figure 3:
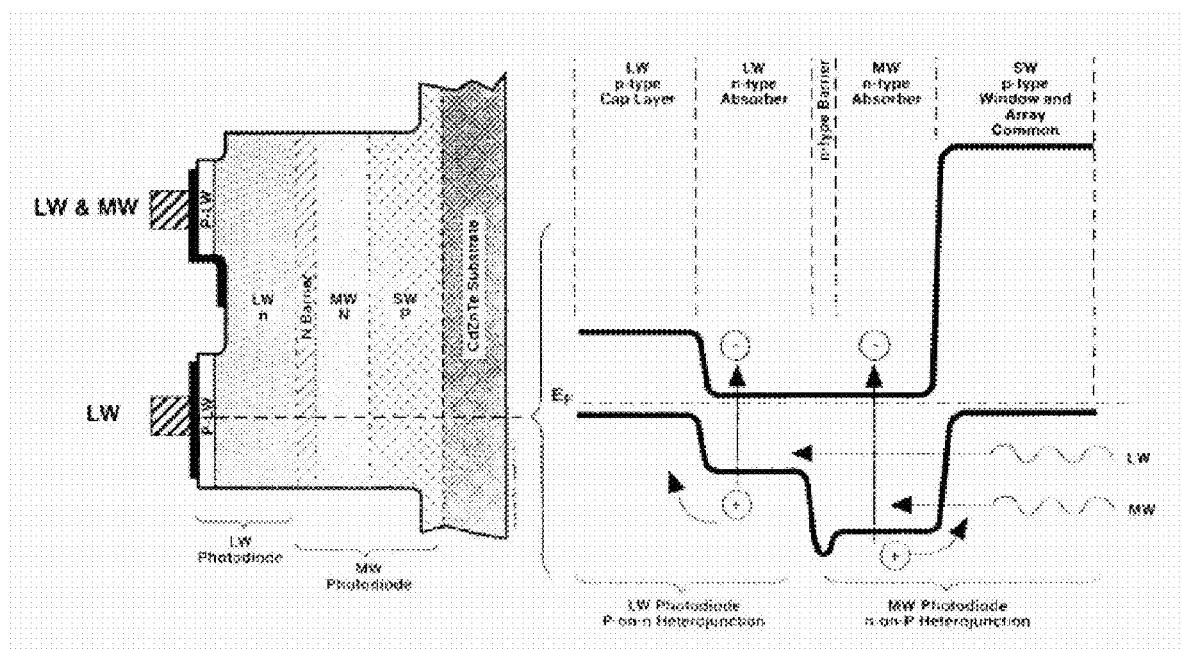
FIG. 3 depicts another detector known in the art.
Figure 4A:
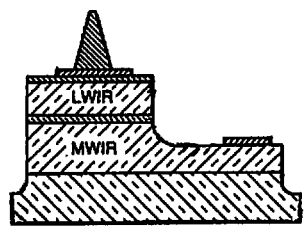
FIGS. 4a-c depict another detector known in the art.
Figure 4B:
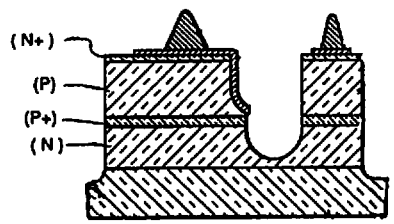
Figure 4C:
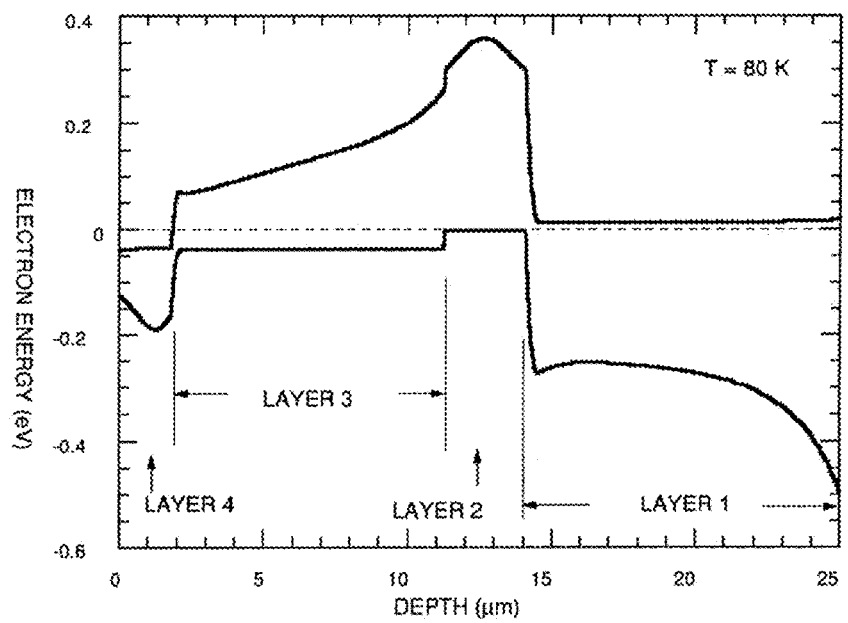
Figure 5:
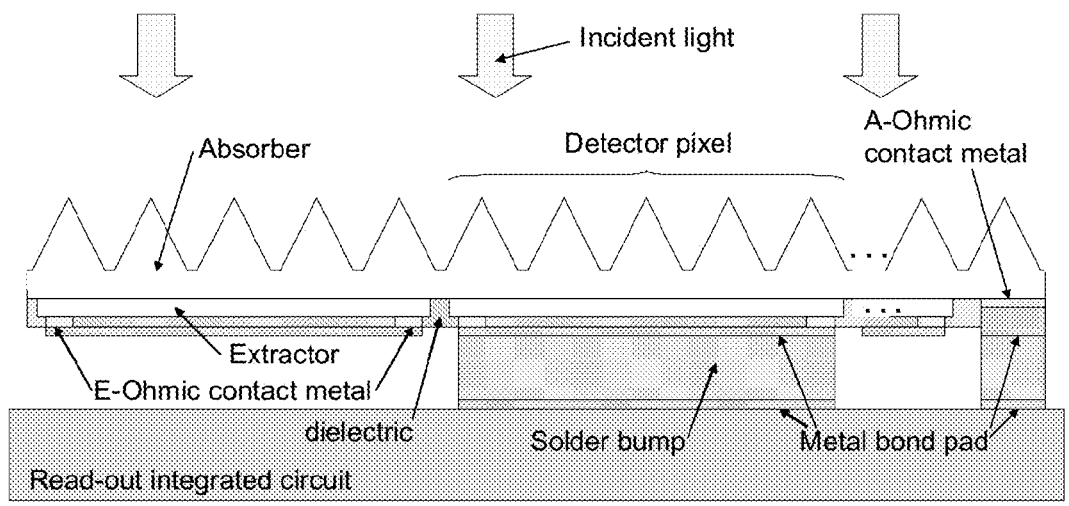
FIG. 5 depicts another detector known in the art.
Figure 6:
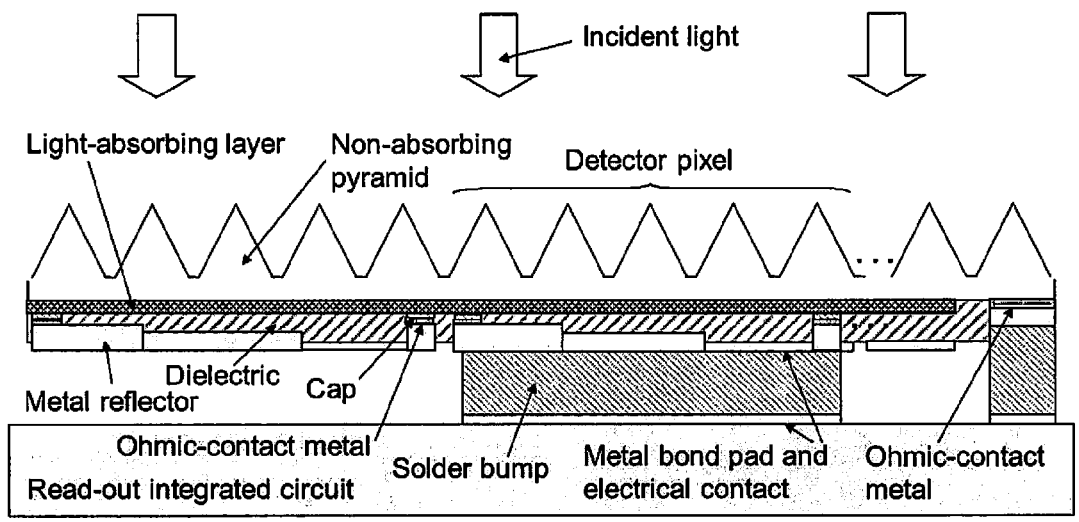
FIG. 6 depicts another detector known in the art.
Figure 7:
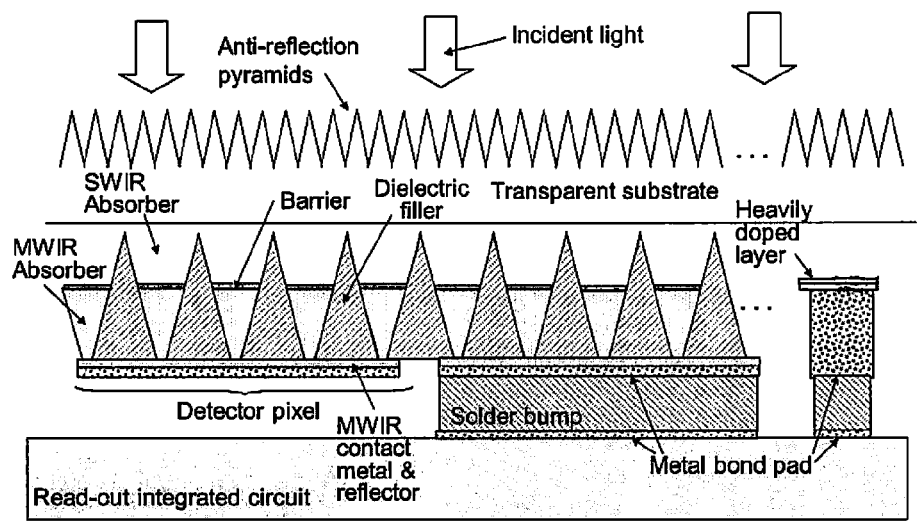
FIG. 7 depicts another detector known in the art.

Because of the effective photon trapping, in some embodiments, the thickness of the MWIR2 absorbing layer 930 can be reduced and still achieve high absorption efficiency. The thickness of the layer 930 can be, for example, roughly 1.0-1.5 µm while achieving an absorption efficiency of about 80% or higher. This thickness, which is smaller than one-half the wavelengths of the MWIR2-band light absorbed by layer 930 is much smaller than the thickness of the absorber layers in prior art detector designs such as those described in FIGS. 1-4. As a result, the size of the via-holes etched through the second light-absorbing layer 930 to permit the formation of electrical contacts to the first light-absorbing layer 920 can be much smaller. In some embodiments, a via-hole size is about 2 µm and represents an aspect ratio of only 1:2 for the via-hole. In contrast, the prior detector shown in FIG. 2 has a minimum via-hole size of 8-10 µm since the thickness of its absorber layer for the longer-wavelength band is approximately 5 µm, even though its quantum efficiency is only 50%. The size of the via-hole constrains the overall size of the detector pixel. Thus a pixel whose size is much smaller than 20 µm can possibly be achieved with the presently disclosed detectors.

Figure 12A:
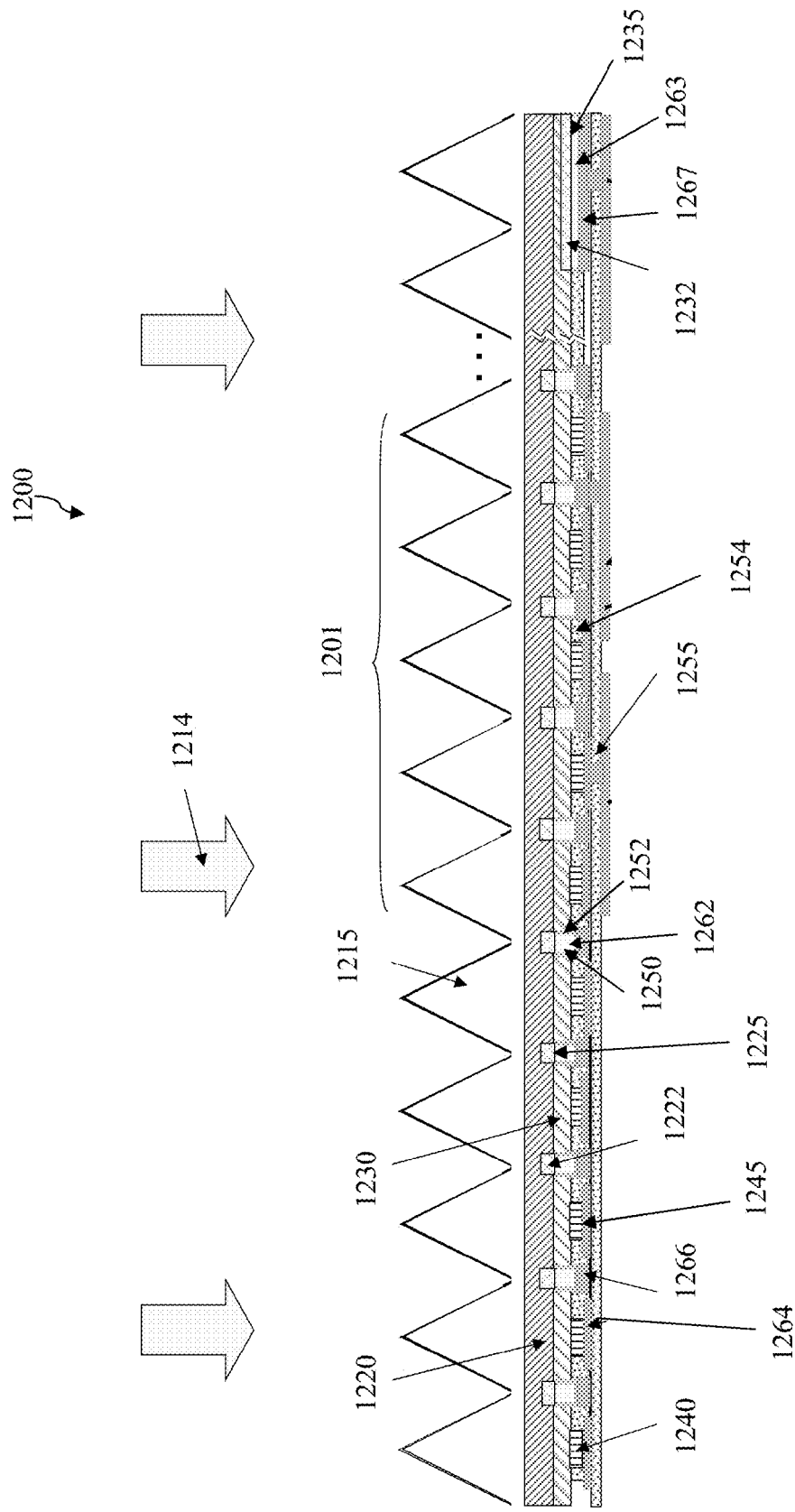
FIGS. 12a-b depict another embodiment of a detector according to the present disclosure.
Figure 12B:
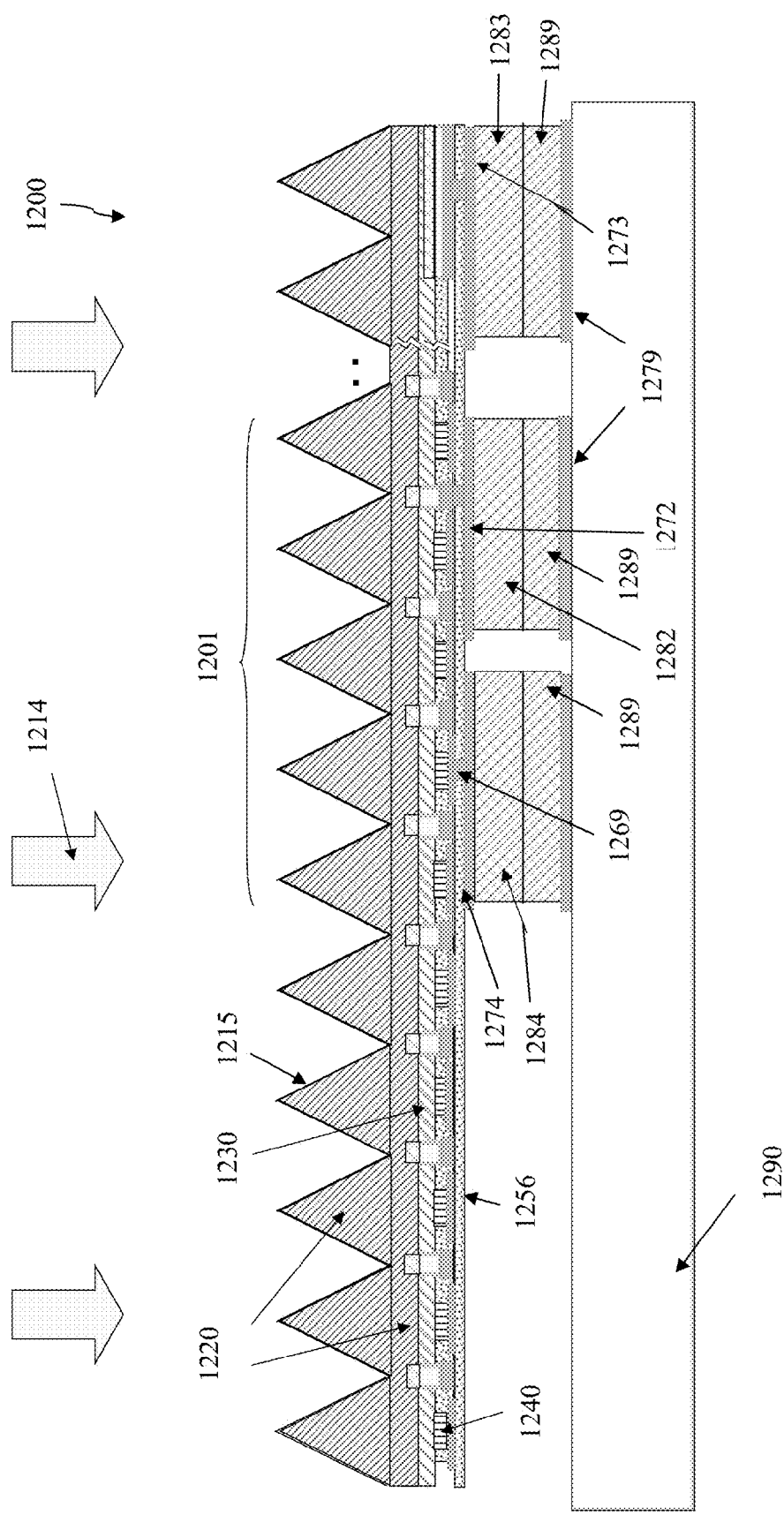

Embodiments of a detector array 1200 according to the present disclosure are shown in FIGS. 12a-b. FIG. 12a highlights the electrical connections at the backside of the detector array 1200 and FIG. 12b illustrates the detector array 1200 connections with a readout circuit 1290. FIG. 12a further illustrates a detector array 1200 whose pyramids 1215 are formed in a layer 1210 of material that is transparent to the incident light 1214 to be detected by the detector array 1200. FIG. 12b illustrates a detector array 1200 whose pyramids 1215 are formed in the material of the first light-absorbing layer 1220.

In some embodiments, the detector array 1200 comprises one or more detector pixel 1210. The detector array 1200 further comprises one or more electrical contacts 1225, which are, for example, ohmic contacts, that are electrically coupled with a first light-absorbing layer 1220. In some embodiments, the detector array 1200 comprises one or more regions 1222 of heavy p-doping formed adjacent with the first light-absorbing layer 1220 and adjacent with the electrical contacts 1225 using, for example, ion implantation and post-implant annealing to facilitate the fabrication of low-resistance ohmic contacts.

In some embodiments, the detector array 1200 comprises at least one electrical contact 1245, which is, for example, an ohmic contact, that is electrically coupled with at least one collector region 1240. In some embodiments, the collector region 1240 is heavily doped. In some embodiments, the detector array 1200 further comprises one or more electrical contacts 1235, which are, for example, ohmic contacts, that are electrically coupled with a second light-absorbing layer 1230. In some embodiments, one or more regions 1232 of heavy n-doping are formed in the second light-absorbing layer 1230 using, for example, an ion implantation and post-implant annealing to facilitate the fabrication of low-resistance ohmic contacts.

In some embodiments, in detector array 1200 comprises pyramidal structures 1215 as shown in FIG. 12a. In some embodiments, the absorption of incident light 1214 is more effective in those portions of the first light-absorbing layer 1220 that are disposed near the peak or tip of a pyramidal structure 1215 and less effective in those portions that are located around the outer base of a pyramidal structure 1215. Since it might be beneficial to minimize the amount of MWIR1 band light that is not absorbed by the first absorber layer but that instead is absorbed in the second absorber layer, in some embodiments, the via-holes 1250 formed in the second light absorber layer 1230 are located beneath the outer base of regions of the pyramidal structures 1215. In some embodiments, the via-holes 1250 may be located beneath the corners of a base of the pyramidal structures 1215.

In some embodiments, despite the via holes 1250 etched into and through the second absorber layer 1230, the second absorber layer 1230 is laterally contiguous and provides a continuous path for the flow of the majority carriers (e.g., electrons) from the regions of the layer in which those carriers are generated to the contact for that layer. In some embodiments, the sides of the via-holes 1250 are covered with a dielectric passivation film 1252. In some embodiments, the via-holes 1250 are filled with, for example, metal, forming metal posts 1262 to provide electrical conduction from the ohmic contacts 1225 for the first light-absorbing layer 1220 to the backside of the detector array 1200.

In some embodiments, the backside of the detector array 1200 is covered with a reflector such as a metal coating. In some embodiments, the metal reflector is constructed from metal interconnect lines 1266 that connect to the metal posts 1262 contacting the first light-absorbing layer 1220, the metal lines 1267 that connect to the contacts 1235 to the second light-absorbing layer 1230 and the metal lines 1264 that connect to the contacts 1245 to the collector 1240. In one embodiment, the metal coating is separated from the second light-absorbing layer 1230 by a dielectric spacer 1254 that has low refractive index.

In some embodiments, the detector array 1200 is electrically coupled with a read-out integrated circuit (ROIC) 1290 as shown in FIG. 12b. In some embodiments, the detector array 1200 is electrically coupled with a read-out integrated circuit 1290 through one or more solder bumps 1282, 1283, 1284, 1289 and one or more metal bond pads 1272, 1273, 1274, and 1279.

Figure 13A:
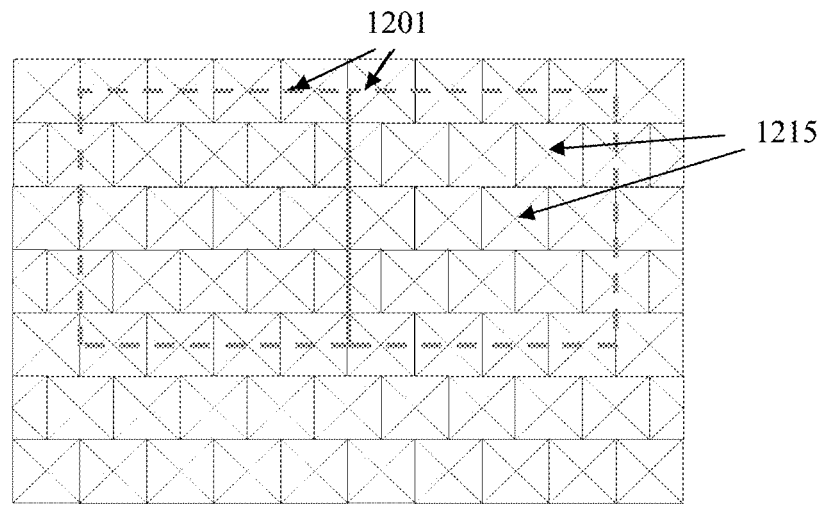
FIGS. 13a-c depict another embodiment of a detector according to the present disclosure.

The dimensions of the pyramidal structures 1215 that are formed on the side of the detector array 1200 facing the incident light 1214 may be designed to minimize the front-side reflection of the incident light 1214 as well as to maximize the trapping of those incident photons in the detector array 1200. For example, in order to obtain good anti-reflection for all wavelengths of light to be detected, the width of the pyramidal structures 1215 may be as large as or larger than one-half the longest wavelength of the light to be absorbed by the detector array 1200. Thus, for example, if the longest wavelength of absorbed light is 5 µm, the width of the pyramidal structures 1215 at their base may be about 2.5 μm. The height of the pyramidal structures 1215 may be on the order of the longest wavelength of the light to be absorbed. Thus, for example, if the longest wavelength of the light to be absorbed is 5 μm, the height of the pyramids may be around 5 μm. The pyramidal structures 1215 may form a continuous pattern on the side of the detector array 1200 facing the incident light 1214, as illustrated in FIG. 13a and in FIG. 14a (depicting the detector array 1200 from the top). A given detector pixel 1201 may comprise many pyramidal structures 1215. The pyramidal structures 1215 may be arranged in a staggered or offset-grid manner, as illustrated in the FIGS. 13a and 14a. Alternatively, the pyramidal structures 1215 may be arranged in any other pattern that provides a desired anti-reflection and photon trapping property. Also, the bases of the pyramidal structures could have other shapes besides the square shapes depicted in these figures. For example, the bases of the pyramidal structures could have hexagonal shapes and be arranged in a hexagonal close-packed configuration.

FIGS. 12a and 12b show side cross-sectional views of the detector array 1200. FIGS. 13b-c and FIGS. 14b-c illustrate portions of several embodiments of the detector array 1200 as viewed from the backside of the array, with different sections of the array illustrated for different array elements or detector pixels 1201 shown in those figures.

Figure 13B:
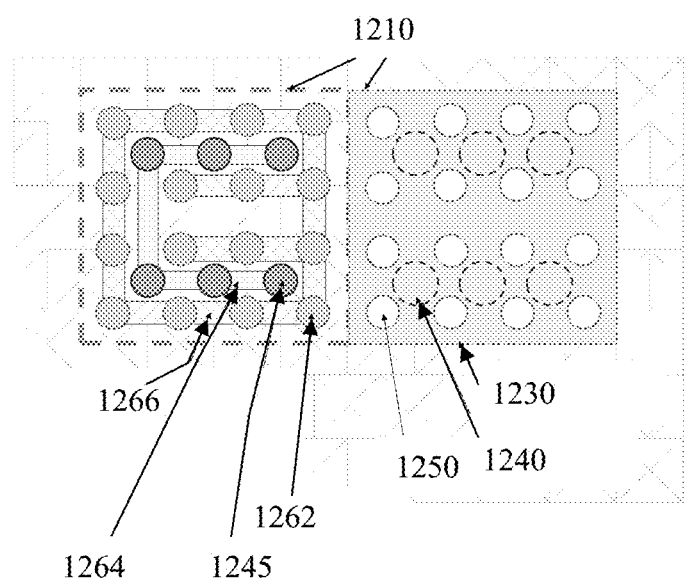

As shown in FIG. 13b (depicting the detector array 1200 from the bottom), in some embodiments, the second light-absorbing layer 1230 may be laterally contiguous and also have vias 1250 etched into it. As shown in FIG. 13b, in some embodiments, a detector element or pixel 1201 comprises metal posts 1262 that provide electrical connections to the contacts 1225 (not visible in FIG. 13b) of the first light-absorbing layer. In some embodiments, these posts 1262 fill the via-holes 1250 in the second light-absorbing layer 1230. These posts 1262 may be separated from the second light-absorbing layer by a dielectric film 1252 (not shown in FIG. 13b but shown in the views depicted in FIGS. 12a and 12b). The posts 1262 may be connected by interconnect lines or traces 1266. In some embodiments, a detector pixel 1201 can have multiple collector regions and electrical contacts 1245 are made to each of those collector regions. The collector contacts 1245 may be connected by interconnect lines or traces 1264.

The configuration of closely-spaced metal contacts 1225 made to the first light-absorbing layer 1220 as well as the small thickness of that first light-absorbing layer remaining after the pyramids are etched may prevent the photo-generated carriers from flowing very far laterally. Instead, the carrier electrons flow through the first barrier and into the second light-absorbing layer. However, the carrier holes, which are blocked by the first carrier-selective barrier, flow laterally a short distance to the contacts 1225 made to the first light-absorbing layer. The holes recombine at the contacts 1225 to produce the output current associated with the band-1 light absorbed in the first light-absorbing layer 1220. Very few carrier holes flow past those contacts 1225 and into the portions of the first light-absorbing layer that are associated with an adjacent detector pixel.

Most of the photo-generated holes in the second light-absorbing layer 1230 flow into the collector regions 1240. Those holes recombine at the collector contacts 1245 to produce the output current associated with the band-2 light absorbed in the second light-absorbing layer. There could be many collector regions 1240 and collector contacts 1245 for each detector pixel, as illustrated in the FIGS. 13a-b. The separation between the collector regions is preferably smaller than two times the lateral diffusion length for the minority carrier holes in the second light-absorbing layer. For example, the diffusion length generally is greater than 5 μm for the InAsSb material.

Figure 13C:
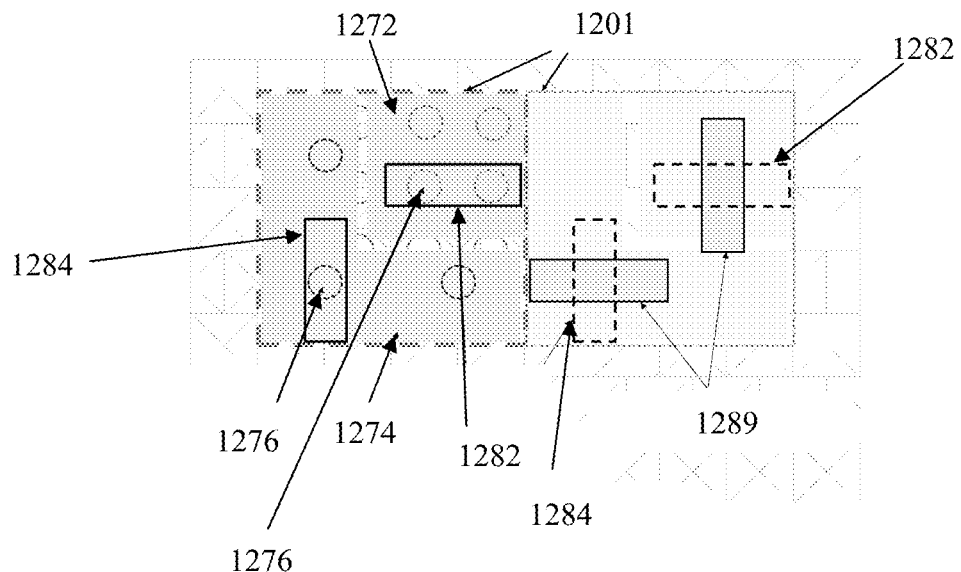

FIG. 13c depicts a configuration, according to some embodiments, of the metal-filled or lined interconnect via-holes 1276, 1278 that electrically connect the metal posts 1262 and collector contacts 1245, respectively, to the bonding pads 1272, 1274 for the solder bumps 1282, 1284 that are formed on the detector pixel. In some embodiments, other bonding pads 1273 and other solder bumps 1283, which are not depicted in FIG. 13c, may be formed near the perimeter of the array 1200. FIG. 13c also illustrates how the size of a detector pixel may be constrained by the size and orientation of the solder bumps 1282, 1284. In some embodiments, the minimum size and the pixel-to-pixel pitch achievable by the presently disclosed detectors may be limited by the size of those solder bumps and by the accuracy obtained in alignment of a detector array to a mating readout circuit. Because the second light-absorbing layer 1230 can be so thin, with a thickness of about 1 μm, the via-holes 1250 etched through the second light-absorbing layer to permit pixel-level electrical contacts to the first light-absorbing layer can be very small, with a diameter as small as, for example, 1-2 μm. FIGS. 13a-c illustrate exemplary detector pixels having a size of, for example, 12 μm×12 μm, with pyramids whose base width is, for example, 3 μm and via-holes of, for example, 1.5 μm in diameter. In some embodiments, the via-holes 1250 may be placed near the edges of adjacent pyramids 1215 and the collector contacts 1245 may be placed beneath the centers of the pyramids 1215. In some embodiments, the collector regions 1240 may be the same size as the collector contacts 1245 or larger than the collector contacts. A detector pixel generally may have at least one via-hole 1250 and also at least one collector contact 1245.

Figure 14A:
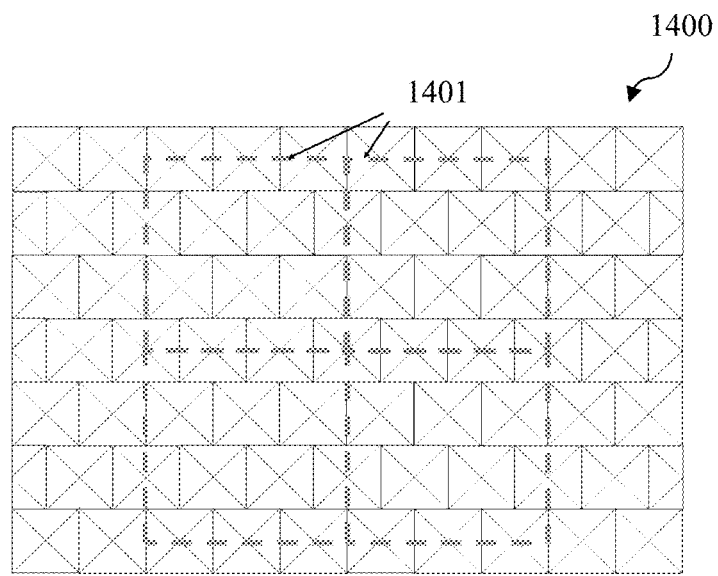
FIGS. 14a-c depict another embodiment of a detector according to the present disclosure.
Figure 14B:
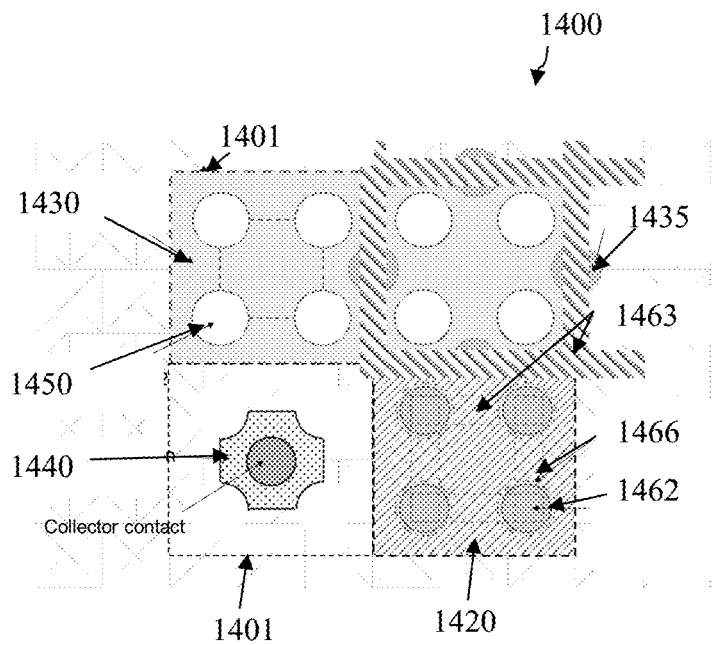
Figure 14C:
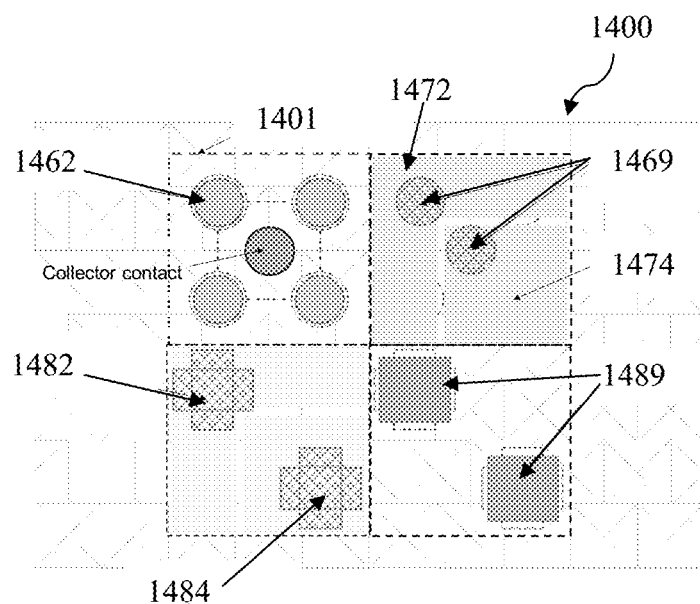

FIGS. 14a-c depict another embodiment of a detector array 1400 according to the present disclosure that has a pixel-to-pixel pitch of about 9 μm. In some embodiments, the detector array 1400 may comprise via-holes 1450 through the second light-absorbing layer 1430, with those via-holes having a diameter of approximately 2 μm, that are placed near the outer corners of each detector pixel 1401 as illustrated in FIG. 14b. In some embodiments, the detector array 1400 may comprise contacts 1435 made to the second light-absorbing layer 1430 that are disposed in the vicinity where adjacent pixels meet as illustrated in FIG. 14b. The contacts 1435 may be interconnected by metal lines 1463 to provide an alternate path for the flow of the return current of the detector array 1400, instead of having that current flow in the second light-absorbing layer itself. In some embodiments, the detector array 1400 comprises a collector region 1440 disposed near the center of each pixel 1401. In some embodiments, the area of the collector region 1440 can be much smaller than the area of the pixel 1401. In some embodiments, the distance from the edge of the collector region 1440 to the perimeter of the pixel 1401 is smaller than the lateral diffusion length of the minority carriers in the second light-absorbing layer.

In some embodiments, the detector array 1400 comprises contacts 1425 electrically coupled with the band-1 absorber layer 1420. In some embodiments, the contacts 1425 are extended by means of metal posts 1462 formed in the via-holes 1450 through the second light-absorbing layer 1430. In some embodiments, a dielectric film (not shown in FIG. 14b but shown as film 1254 in FIGS. 12a and 12b) is deposited over the pixel and could cover the sidewalls of the via-holes 1450 as well as the sides and a portion of the tops of the collector region 1440. In some embodiments, the metal posts 1462 may be electrically connected with each other by means of metal interconnect lines 1466 that are formed over the dielectric layer.

In some embodiments, a second dielectric layer (not shown in FIG. 14b but shown as film 1256 in FIGS. 12a and 12b) is deposited to cover the interconnect lines 1463, 1466 and collector contacts 1445. In some embodiments, metal-filled vias 1469 are penetrate through this dielectric second layer 1456 to permit electrical contact between the interconnect lines 1466, 1463 and collector contacts 1445 and the bond pads 1472, 1473, 1474 that are formed above this dielectric layer 1456, as illustrated in FIG. 14c. Solder bumps 1482, 1483, 1484 may be formed over the bond pads 1472, 1473, 1474. The solder bumps 1482, 1483 1484 on the array 1400 can mate with solder bumps 1489 formed on the read-out integrated circuit. In some embodiments, the metal contacts, interconnect lines and bond pads cover almost the entire area of a pixel. They may also serve a second function as optical reflectors, with the reflecting surfaces being at several different values of spacing away from the second light-absorbing layer. Such a stepped reflector facilitates the broadband absorption of the incident light. Various shapes of solder bumps known in the art could be used for the detector array 1400 and for the readout circuit. In some embodiments, the configuration of solder bumps may be suitable for array-to-readout alignment accuracy of several micrometers.

In some embodiments, the first light-absorbing layer 1420 of the detector array 1400 covers the entire area of each pixel 1401. In some embodiments, the second light-absorbing layer 1430 of the detector array 1400 covers the entire area of each pixel, except for the via-holes 1450 etched through that layer 1430. Even though the second light-absorbing layer has holes in it, the fill fraction of the overall pixel area that is occupied by the material of the second light-absorbing layer is very high. The fill fraction may be, for example, between 84% and 90% for the two examples shown in FIGS. 13 and 14. High fill fraction is an advantage of the presently disclosed detector when compared with the fill fraction of the prior mesa-defined, dual-band detectors.

Figure 15:
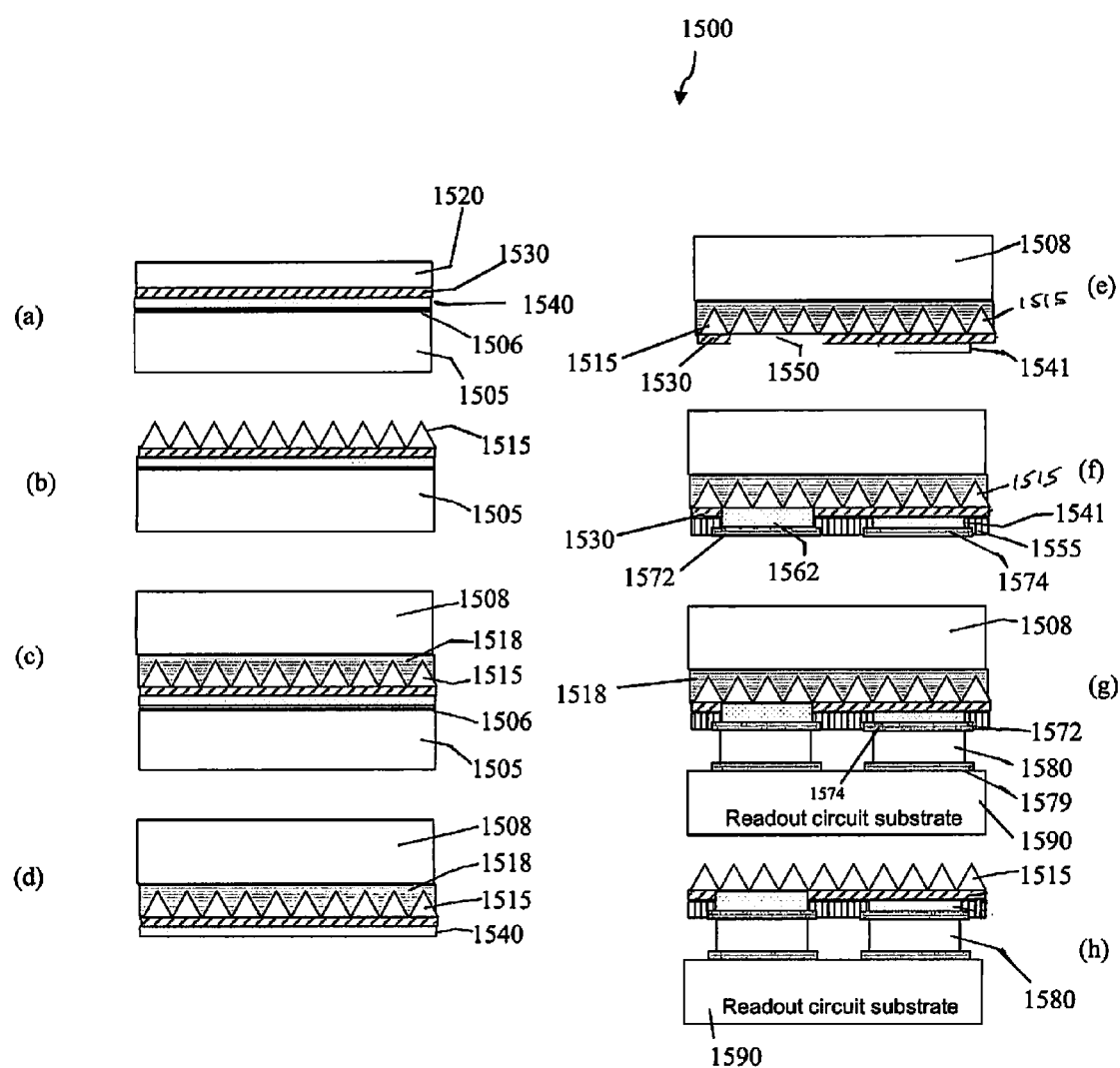
FIG. 15 depicts a process for fabricating a detector according to the present disclosure.

Referring to FIGS. 15a-h, in one embodiment, a fabrication process 1500 for the presently disclosed detector array(s) is presently described. Referring to FIG. 15a, the fabrication process 1500 comprises providing a substrate 1505; growing a buffer layer (not shown) above the substrate 1505 using for example, an epitaxial growth process; growing an etch stop layer 1506 above the substrate 1505 using, for example an epitaxial growth process; growing a collector layer 1540 above the etch stop layer 1506 using, for example an epitaxial growth process; growing a second barrier structure (not shown) above the collector layer 1540 using, for example an epitaxial growth process; growing a band-2 absorber layer 1530 above the second barrier structure using, for example an epitaxial growth process; growing a first barrier structure (not shown) above the absorber layer 1530 using, for example an epitaxial growth process; growing a band-1 absorber layer 1520 above the first barrier structure using, for example an epitaxial growth process.

In some embodiments, the fabrication process 1500 comprises growing a final layer (not shown) above the band-1 absorber layer 1520 for forming pyramidal structures 1515. In some embodiments, the final layer comprises a material having a wider bandgap such that the incident light to be detected is not absorbed. In some embodiments, the fabrication process 1500 comprises forming pyramidal structures 1515 out of the band-1 absorber layer 1520 or out of the final layer 1510 as described below with reference to FIGS. 15a-h.

In some embodiments, the first barrier structure (which is grown between the band-1 absorber layer 1520 and the band-2 absorber layer 1530) comprises a single layer. In some embodiments, the first barrier structure (which is grown between the band-1 absorber layer 1520 and the band-2 absorber layer 1530) comprises multiple layers. In some embodiments, the second barrier structure (which is grown between the band-2 absorber layer 1530 and the collector layer 1540) comprises a single layer. In some embodiments, the second barrier structure (which is grown between the band-2 absorber layer 1530 and the collector layer 1540) comprises multiple layers.

In some embodiments, the materials of the epitaxial layers described with reference to FIG. 15a are characterized by a lattice constant that is different from the lattice constant of the substrate 1505. For example, GaSb-based and InAs-based compounds may be grown on a GaAs substrate wafers. In some embodiments, the various absorber layers 1520, 1530 and the final layer comprise materials of different lattice constant.

Referring to FIG. 15b, the fabrication process 1500 comprises etching of pyramidal shapes 1515 in the band-1 absorber layer 1520 or in the wide bandgap final layer above that band-1 absorber layer 1520. In some embodiments, the etched recesses forming the pyramids 1515 do not penetrate through the first barrier layer (not shown) and into the band-2 absorber layer 1530. In some embodiments, etched recesses of various sidewall angles as well as sidewall curvatures are formed by combinations of, for example, dry etching (such as reactive ion etching or ion milling) and wet-chemical etching processes. In some embodiments, the exposed surfaces of band-1 absorber material 1520 are coated with a surface passivation layer (not shown).

Referring to FIG. 15c, the fabrication process 1500 comprises mounting the detector wafer onto a carrier wafer 1508 such that the back side of the substrate 1505 is exposed. In some embodiments, a layer of planarization/adhesion material 1518 is used to fill the spaces between the pyramids 1515 and also between the pyramids and the carrier wafer 1508. In another embodiment, an optional layer of material (not shown), such as, for example, a high temperature wax or resin, is deposited over the pyramid features 1515 to protect them from physical damage as the detector layers are mounted and later de-mounted. Referring to FIG. 15d, the fabrication process 1500 comprises removing the substrate 1505 with the etch stop layer 1506 serving to control the substrate-removal process. Referring to FIG. 15d, the fabrication process 1500 further comprises removing the etch stop layer 1506 to expose the collector layer 1540.

Referring to FIG. 15e, the fabrication process 1500 comprises patterning and etching collector layer 1540 to form separate collector regions 1541; etching via-openings 1550 through the band-2 absorber layer 1530 and the first barrier layer (not shown);

Referring to FIG. 15f, the fabrication process 1500 comprises etching via-holes 1550 through the band-2 absorber layer 1530; etching the collector layer 1540 into separate collector regions 1541; forming a film of dielectric passivation material 1555 to cover via-holes 1550 and the collector regions 1541; removing portions of the dielectric film 1555 from the areas for the contacts to the band-1 absorber layer, to the band-2 absorber layer and also to the collector; forming heavily doped regions (not shown) of the band-1 and the band-2 absorber material using, for example, ion implantation and annealing; forming P-type Ohmic metal contacts (not shown) upon the exposed band-1 absorber layer 1520; forming N-type Ohmic metal contacts (not shown) upon the exposed band-2 absorber layer 1530; forming N-type Ohmic metal contacts (not shown) upon the exposed collector regions 1541; forming metal posts 1562 over the band-1 absorber layer contacts in the via-openings 1550; and forming other, shorter, metal posts (not shown) over the band-2 contacts. The heights of these various posts can be selected such that the tops of the posts and the tops of the collector contacts are level with each other. Also, metal interconnect lines (not shown) can be formed to connect between selected combinations and patterns of posts and collector contacts. One or more films of a dielectric material may also be deposited to cover and fill the spaces between those posts, interconnect lines and contacts. Finally, bond pads 1572, 1574 can be formed above the dielectric film and located over those posts and contacts.

Referring to FIG. 15*g*, the fabrication process 1500 comprises forming solder bumps 1580 attached to the bond pads 1572, 1574; bonding the detector array onto the readout circuit substrate 1590, which may contain matching solder bumps attached to bond pads formed on the readout circuit substrate. In some embodiments, the spaces between the solder bumps 1580 are filled with some material to increase the mechanical strength of the assembly. Referring to FIG. 15*h*, the fabrication process 1500 comprises removing the carrier substrate 1508 and the planarization/adhesion material 1518 to expose the pyramid-containing surface 1515 of the detector array.

If the band-1 and band-2 wavelengths are in the 1.5 to 5.0 µm wavelength range, simulations on the optical absorbance characteristics of the presently disclosed detectors suggest that high, >95%, absorption of the band-1 light by the band-1 absorber regions may be achieved. This efficiency absorption is achieved even though the effective thickness of the band-1 material is only 4 µm and the thickness of the laterally contiguous portion of the band-1 absorber is between 0.5 and 2 µm. Also, 75-80%, or higher, absorption of the band-2 light by the band-2 absorber layer can be achieved even when the thickness of that band-2 absorbing layer is only 1 µm. As discussed above, the thin band-2 absorber layer makes possible the small size and close spacing of the contacts made to the band-1 absorbing regions. Also, the size and spacing of the contacts made to the collector regions can be just as small. Thus, it may be possible to achieve a dual-band detector array, capable of providing simultaneous pixel-specific outputs for the photocurrents of both bands, that has a pixel-to-pixel spacing of 10-15 µm. This makes possible large-format, area-efficient dual-band imagers that are capable of operating at elevated temperatures above 130 K and that can have more than 1 million pixels.

Furthermore, the presently disclosed dual-band detectors, because of the reduced volume of their longer-wavelength light-absorbing material, can operate at much higher temperature while still achieving high sensitivity. The higher operation temperature (>130 K-200 K) made possible by the disclosed invention could greatly reduce the size and cost of the infrared imaging systems since cryogenic cooling would not be needed. The possibility of operating at temperatures achievable with thermoelectric-coolers also increases the breadth of commercial applications since the imagers and detector arrays would be more affordable.

While several illustrative embodiments of the invention have been shown and described, numerous variations and alternative embodiments will occur to those skilled in the art. Such variations and alternative embodiments are contemplated, and can be made without departing from the scope of the invention as defined in the appended claims.

As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

The foregoing detailed description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "step(s) for . . . ."

What is claimed is:

1. An infrared photo-detector array of a plurality of photo-detectors, comprising:
   a collector layer:
   a first absorber layer that absorbs incident light of a first wavelength band and generates first electrons and first holes;
   a second absorber layer that absorbs incident light of a second wavelength band and generates second electrons and second holes; and
   wherein the wavelengths of the incident light in the first wavelength band are shorter than the wavelengths of the incident light in the second wavelength band;
   wherein the second absorber layer is laterally contiguous across at least two photo-detectors; and
   wherein the thickness of the second absorber layer is smaller than the wavelengths of light of the second wavelength band.

2. The infrared photo-detector array of claim 1, wherein the first absorber layer is laterally contiguous across at least two photo-detectors.

3. The infrared photo-detector array of claim 1, further comprising one or more via-holes etched through the second absorber layer.

4. The infrared photo-detector array of claim 3, further comprising metal contacts adjacent to the first absorber layer, wherein the metal contacts are disposed within the one or more via-holes.

5. The infrared photo-detector array of claim 3, further comprising metal posts or metal fill within the one or more via-holes.

6. The infrared photo-detector array of claim 1, wherein the second absorber layer conducts first electrons or first holes generated in the first absorber layer; and the second absorber layer conducts second electrons or second holes generated in the second absorber layer.

7. The infrared photo-detector array of claim 1, wherein the collector layer comprises one or more collector regions, wherein an area, as determined by a width or a diameter, of at least one collector region is smaller than an area, as determined by a width or other lateral dimension, of at least one photo-detector.

8. The infrared photo-detector array of claim 7, further comprising metal contacts in electrical contact with the one or more collector regions;
wherein each collector region has a metal contact in electrical contact with that collector region and associated with that collector region, and
wherein the multiple collector regions of a photo-detector and the metal contacts associated with those multiple collector regions are in electrical contact with each other.

9. The infrared photo-detector array of claim 1, further comprising:
a first barrier structure disposed between the first absorber layer and the second absorber layer; and
a second barrier disposed between the second absorber layer and the collector layer.

10. The infrared photo-detector array of claim 9, wherein the first absorber layer comprises a p-type material and the second absorber layer comprises an n-type material.

11. The infrared photo-detector array of claim 9, wherein the first barrier structure blocks flow of holes between the first absorber layer and the second absorber layer.

12. The infrared photo-detector array of claim 9, wherein the first barrier blocks flow of electrons from the second absorber layer to the first absorber layer, wherein the first barrier allows flow of electrons from the first absorber layer to the second absorber layer.

13. The infrared photo-detector array of claim 9, wherein the second barrier blocks flow of electrons between the second absorber layer and the collector regions.

14. The infrared photo-detector array of claim 13, wherein the second barrier allows flow of holes from the second absorber layer into the collector regions.

15. The infrared photo-detector array of claim 9, wherein the second barrier blocks flow of holes from the collector regions into the second absorber layer.

16. The infrared photo-detector array of claim 1, further comprising:
metal interconnect lines; and
metal bond pads;
wherein the metal interconnect lines and metal bond pads form a stepped optical reflector of the incident light.

17. The infrared photo-detector array of claim 16, wherein the first absorber layer is disposed on a side of the second absorber layer that faces incident light, and wherein the collector layer is disposed on an opposite side of the second absorber layer.

18. The infrared photo-detector array of claim 17, wherein the metal interconnect lines and the metal bond pads are disposed on the side of the second absorber layer away from incident light.

19. The infrared photo-detector array of claim 18, further comprising pyramid shaped structures associated with the first absorber layer.

20. The infrared photo-detector array of claim 17, further comprising pyramid shaped structures disposed above the first absorber layer opposite the side of the first absorber layer facing the second absorber layer.

21. The infrared photo-detector array of claim 20, wherein the pyramid shaped structures are transparent to light of the first and second wavelength bands.

22. The infrared photo-detector array of claim 16, further comprising a dielectric spacer disposed between the metal interconnect lines and the second absorber layer.

23. The infrared photo-detector array of claim 16, further comprising a dielectric material disposed between collector regions and the metal interconnect lines.

24. The infrared photo-detector array of claim 16, further comprising a dielectric material disposed between sidewalls of a via-hole and a metal post or metal fill in that via-hole.

25. The infrared photo-detector array of claim 1, wherein the first absorber layer comprises a material with a first cutoff wavelength, the second absorber layer comprises a material with a second cutoff wavelength; and the collector layer comprise a material of a third cutoff wavelength; wherein the first cutoff wavelength is shorter than the second cutoff wavelength.

26. The infrared photo-detector array of claim 25, wherein the third cutoff wavelength is shorter than the first cutoff wavelength.

27. The infrared photo-detector array of claim 7, wherein at least one collector region is disposed at a center of a photo-detector.

28. The infrared photo-detector array of claim 7, wherein at least one collector region is disposed beneath and aligned with the center of at least one pyramid shaped structure associated with a photo-detector.

29. The infrared photo-detector array of claim 1, wherein the collector layer comprises n-type material.

* * * * *